(12) United States Patent
Yazami et al.

(10) Patent No.: US 11,677,102 B2
(45) Date of Patent: Jun. 13, 2023

(54) ADAPTIVE CHARGING PROTOCOL FOR FAST CHARGING OF BATTERIES AND FAST CHARGING SYSTEM IMPLEMENTING THIS PROTOCOL

(71) Applicant: Yazami IP PTE. LTD., Singapore (SG)

(72) Inventors: Rachid Yazami, Singapore (SG); Thannehene Gedara Thusitha Asela Bandara, Singapore (SG)

(73) Assignee: Yazami IP PTE. LTD., Singapore (SG)

( * ) Notice: Subject to any disclaimer, the term of this patent is extended or adjusted under 35 U.S.C. 154(b) by 307 days.

(21) Appl. No.: 16/770,566

(22) PCT Filed: Dec. 7, 2018

(86) PCT No.: PCT/IB2018/059756
§ 371 (c)(1),
(2) Date: Jun. 5, 2020

(87) PCT Pub. No.: WO2019/162750
PCT Pub. Date: Aug. 29, 2019

(65) Prior Publication Data
US 2021/0167620 A1     Jun. 3, 2021

(30) Foreign Application Priority Data
Dec. 7, 2017 (SG) .......................... 10201710151Y

(51) Int. Cl.
*H01M 10/44* (2006.01)
*G01R 31/387* (2019.01)
(Continued)

(52) U.S. Cl.
CPC .......... *H01M 10/44* (2013.01); *G01R 31/387* (2019.01); *H01M 10/0525* (2013.01);
(Continued)

(58) Field of Classification Search
CPC .. H01M 10/44; H01M 10/0525; H01M 10/46; H01M 10/48; H02J 7/0048;
(Continued)

(56) References Cited

U.S. PATENT DOCUMENTS

| | | | |
|---|---|---|---|
| 4,370,606 A | 1/1983 | Kakumoto et al. | |
| 4,728,807 A | 3/1988 | Harafuji et al. | |

(Continued)

FOREIGN PATENT DOCUMENTS

WO    2019/111226 A1    6/2020

OTHER PUBLICATIONS

Machine Translation of WO 2011/162014, 37 pages (Year: 2011).*

(Continued)

*Primary Examiner* — Nathaniel R Pelton
(74) *Attorney, Agent, or Firm* — TraskBritt

(57) ABSTRACT

An adaptive charging protocol (ACP) implemented for fast-charging a rechargeable battery having electrode terminals connected to terminals of a power supply provided to apply time-varying voltages to the electrodes, comprising, before starting a charging operation for the battery, the steps of: detecting the existence of historical data on previous charging operations for the battery; in case of detection, processing the historical data to adjust charging parameters in view of optimizing the charging operation; in absence of detection, electrically testing the battery to get data on variations of the state of charge (SOC) for the battery, in view of building a learning model on the SOC variations to be used for optimizing the charging operation.

22 Claims, 21 Drawing Sheets

(51) Int. Cl.
*H02J 7/00* (2006.01)
*H01M 10/0525* (2010.01)
*H01M 10/46* (2006.01)
*H01M 10/48* (2006.01)

(52) U.S. Cl.
CPC ............ *H01M 10/46* (2013.01); *H02J 7/005* (2020.01); *H02J 7/007* (2013.01); *H02J 7/0048* (2020.01); *H02J 7/0071* (2020.01); *H02J 7/00714* (2020.01); *H02J 7/00718* (2020.01); *H02J 7/007184* (2020.01); *H01M 10/48* (2013.01); *H02J 7/0047* (2013.01); *H02J 7/00712* (2020.01)

(58) Field of Classification Search
CPC ...... H02J 7/005; H02J 7/00714; H02J 7/0071; H02J 7/007; G01R 31/387
USPC ........................................................ 320/160
See application file for complete search history.

(56) References Cited

U.S. PATENT DOCUMENTS

| | | | |
|---|---|---|---|
| 5,998,968 | A | 12/1999 | Pittman et al. |
| 6,064,182 | A | 5/2000 | Eguchi |
| 6,417,668 | B1 | 7/2002 | Howard et al. |
| 6,495,992 | B1 | 12/2002 | Pavlovic |
| 6,965,216 | B2 | 11/2005 | Pavlovic et al. |
| 7,245,185 | B2 | 7/2007 | Litovsky et al. |
| 7,595,611 | B2 | 9/2009 | Reynier et al. |
| 8,160,834 | B2 | 4/2012 | Liang et al. |
| 8,446,127 | B2 | 5/2013 | Yazami et al. |
| 8,901,892 | B2 | 12/2014 | Yazami et al. |
| 9,065,292 | B2 | 6/2015 | Yazami |
| 9,229,510 | B2 | 1/2016 | Chiueh et al. |
| 9,285,433 | B2 | 3/2016 | Kurimoto |
| 9,321,368 | B2 | 4/2016 | Yang et al. |
| 9,397,516 | B2 | 7/2016 | Hunter et al. |
| 9,461,492 | B1 | 10/2016 | Berkowitz et al. |
| 9,539,912 | B2 | 1/2017 | Li |
| 9,551,759 | B2 | 1/2017 | Yazami et al. |
| 9,599,584 | B2 | 3/2017 | Yazami et al. |
| 9,720,046 | B2 | 8/2017 | Tazoe et al. |
| 9,995,794 | B2 | 6/2018 | Yazami et al. |
| 10,067,198 | B2 | 9/2018 | Maluf et al. |
| 10,205,401 | B1 | 2/2019 | Nikitin |
| 10,302,703 | B2 | 5/2019 | Fleischer et al. |
| 10,353,003 | B2 | 7/2019 | Stulrajter |
| 10,447,055 | B1 | 10/2019 | Berkowitz et al. |
| 10,556,510 | B2 | 2/2020 | Yazami |
| 2003/0094927 | A1 | 5/2003 | Pavlovic et al. |
| 2003/0206021 | A1 | 11/2003 | Laletin et al. |
| 2004/0119445 | A1 | 6/2004 | Wakeman |
| 2004/0128089 | A1 | 7/2004 | Barsoukov et al. |
| 2007/0182418 | A1 | 8/2007 | Reynier et al. |
| 2009/0110214 | A1 | 4/2009 | Litovsky et al. |
| 2009/0234601 | A1 | 9/2009 | Wu et al. |
| 2010/0090650 | A1 | 4/2010 | Yazami et al. |
| 2010/0169035 | A1 | 7/2010 | Liang et al. |
| 2011/0230741 | A1 | 9/2011 | Liang et al. |
| 2012/0043929 | A1* | 2/2012 | Yazami ............ H02J 7/007184 320/160 |
| 2012/0098481 | A1 | 4/2012 | Hunter et al. |
| 2012/0306450 | A1 | 12/2012 | Nakayama et al. |
| 2013/0090872 | A1 | 4/2013 | Kurimoto |
| 2013/0271089 | A1 | 10/2013 | Yazami et al. |
| 2013/0322488 | A1 | 12/2013 | Yazami et al. |
| 2014/0157034 | A1 | 6/2014 | Chiueh et al. |
| 2014/0354233 | A1 | 12/2014 | Yazami et al. |
| 2014/0375275 | A1 | 12/2014 | Hung et al. |
| 2015/0231986 | A1* | 8/2015 | Li ........................ B60L 58/13 903/903 |
| 2015/0377976 | A1 | 12/2015 | Maluf et al. |
| 2015/0377977 | A1 | 12/2015 | Yazami et al. |
| 2016/0052418 | A1 | 2/2016 | Yang et al. |
| 2016/0064979 | A1 | 3/2016 | Huang et al. |
| 2016/0084913 | A1 | 3/2016 | Lupo et al. |
| 2016/0146895 | A1 | 5/2016 | Yazami |
| 2018/0196107 | A1 | 7/2018 | Fleischer et al. |
| 2019/0036367 | A1* | 1/2019 | Sultenfuss ............ H02J 50/80 |
| 2019/0305674 | A1 | 10/2019 | Liu et al. |
| 2020/0143982 | A1 | 5/2020 | Rochford et al. |
| 2020/0227221 | A1 | 7/2020 | Reuber |
| 2021/0055353 | A1 | 2/2021 | Yazami et al. |
| 2021/0057926 | A1 | 2/2021 | Yazami |
| 2021/0091421 | A1 | 3/2021 | Yazami |
| 2021/0208208 | A1 | 7/2021 | Yazami |

OTHER PUBLICATIONS

Jiang et al., Evaluation of Acceptable Charging Current of Power Li-Ion Batteries Based on Polarization Characteristics, IEEE Transaction on Industrial Electronics, vol. 61, No. 12, (Dec. 2014), pp. 6844-6851 (Year: 2014).*

International Search Report for International Application No. PCT/IB2018/059756 dated Jul. 30, 2019, 4 pages.

International Written Opinion for International Application No. PCT/IB2018/059756 dated Jul. 30, 2019, 9 pages.

Jiang et al., An Optimal Charging Method for Li-Ion Batteries Using a Fuzzy-Control Approach Based on Polarization Properties, Transactions on Vehicular Technology, vol. 62, Issue 7, (Sep. 2013), abstract only.

Xiong et al., Critical Review on the Battery State of Charge Estimation Methods for Electric Vehicles, IEEE Access, vol. 6, (2018), pp. 1832-1843.

Andrea, David, Battery Management Systems for Large Battery Packs, ISBN-13 978-1-60807-104-3, (2010), Chapter I, 28 pages.

Ansean et al., Efficient Fast-Charging Strategies for Li-Ion Batteries, Conference: EVS28 International Electric Vehicle Symposium and Exhibition—Kintex, Korea, (May 3-6, 2015), 11 pages.

Ayoub et al., Review on the Charging Techniques of a Li-ion Battery, 2015 Third International Conference on Technological Advances in Electrical, Electronics and Computer Engineering (TAEECE), (Apr. 29-May 1, 2015), 7 pages.

Bandara et al., Adaptive Charging Protocol (ACP) Based on Non-Linear Voltammetry (NLV) Charging Patterns for Fast Charging Li-Ion Batteries, International Journal of Engineering Science Invention, www.ijesi.org, Bol. 7, Issue 12, Ver. III, (Dec. 2018), pp. 44-58.

Baroody et al., Evaluation of Rapid Electric Battery Charging Techniques, UNLV These, Dissertations, Professional Papers, and Capstones, (2009), https://digitalscholarship.unlv.edu/cgi/viewcontent.cgi?article=1162&context=thesesdissertations, 68 pages.

Bazant, Martin Z., Theory of Chemical Kinetics and Charge Transfer Based on Nonequilibrium Thermodynamics, Accounts of Chemical Research, Acc. Chem. Res. (2013), 46, 5, 1144-1160.

He et al., *-Aware Charging of Lithium-ion Battery Cells, IEEE, https://rtcl.eecs.umich.edu/rtclweb/assets/publications/2016/StarAware-ICCPS16.pdf, Proceedings of the 7th International Conference on Cyber-Physical Systems, (Apr. 2016), Article No. 26, pp. 1-10.

Hu et al., Estimation of State of Charge of Lithium-Ion Battery Pack for Electric Vehicles using an Adaptive Luenberger Observer, www.mdpi.com/journal/energies, Energies, (2010), vol. 3, pp. 1586-1603.

International Search Report for International Application No. PCT/IB2018/059766, dated Mar. 22, 2019, 4 pages.

International Written Opinion for International Application No. PCT/IB2018/059766, dated Mar. 22, 2019, 8 pages.

Jiang et al., An Optimal Charging Method for Li-Ion Batteries using a Fuzzy-Control Approach Based on Polarization Properties, IEEE Transactions on Vehicular Technology, vol. 62, No. 7, (Sep. 2013), pp. 3000-3009.

Jiang et al., Evaluation of Acceptable Charging Current of Power Li-Ion Batteries Based on Polarization Characteristics, IEEE Transactions on Industrial Electronics, vol. 61, No. 12, (Dec. 2014), pp. 6844-6851.

(56) References Cited

OTHER PUBLICATIONS

Kim, Il-Song, The Novel State of Charge Estimation Method for Lithium Battery using Sliding Mode Observer, Journal of Power Sources, vol. 163, (2006), pp. 584-590.

Ramadesigan et al., Modeling and Simulation of Lithium-Ion Batteries from a Systems Engineering Perspective, Journal of the Electrochemical Society, (2012), vol. 159, No. 3, pp. R31-R45.

Zhang, Sheng Shui, The Effect of the Charging Protocol on the Cycle Life of a Li-ion Battery, Journal of Power Sources, vol. 161, (2006), pp. 1385-1391.

\* cited by examiner

Capacity Gain during "$x^{th}$" second is considered as:
$C_{gain} = I_{x+1} * (2)/ 3600$ [mAh, "I" in mA]

| Selected K | K-Generated | AVG (Abs(dl/dt)) | Abs [dl/dt(n-1)] | Abs [dl/dt(n-2)] | dV/dt | NLVSet Voltage | Prev Voltage | AVG \|(dl/dt)\| *dv/dt |
|---|---|---|---|---|---|---|---|---|
| 0.39146667 | 0.391466667 | 223.5 | 141 | | | 4.772282 | 4.770823 | 0.391466667 |
| 0.39146667 | 0.391466667 | 223.5 | 141 | 306 | 0.043788218 | 4.772282 | 4.770823 | 0.391466667 |
| 0.39146667 | 0.391466667 | 75 | 9 | 306 | 0.043788218 | 4.776632 | 4.772282 | 0.391466667 |
| 0.39146667 | 0.391466667 | 75 | 9 | 141 | 0.130488889 | 4.776632 | 4.772282 | 0.391466667 |
| 0.39146667 | 0.391466667 | 286.8 | 564.6 | 141 | 0.130488889 | 4.77777 | 4.776632 | 0.391466667 |
| 0.39146667 | 0.391466667 | 286.8 | 564.6 | 9 | 0.034123663 | 4.77777 | 4.776632 | 0.391466667 |
| 0.39146667 | 0.239325867 | 339.6 | 114.6 | 9 | 0.034123663 | 4.778357 | 4.77777 | 0.239325867 |
| 0.39146667 | 0.239325867 | 339.6 | 114.6 | 564.6 | 0.017618218 | 4.778357 | 4.77777 | 0.239325867 |
| 0.39146667 | 0.353076267 | 154.8 | 195 | 564.6 | 0.017618218 | 4.780258 | 4.778357 | 0.353076267 |
| 0.39146667 | 0.353076267 | 154.8 | 195 | 114.6 | 0.057021361 | 4.780258 | 4.778357 | 0.353076267 |
| 0.39146667 | 0.391466667 | 127.2 | 59.4 | 114.6 | 0.057021361 | 4.782822 | 4.780258 | 0.391466667 |
| 0.39146667 | 0.391466667 | 127.2 | 59.4 | 195 | 0.076939203 | 4.782822 | 4.780258 | 0.391466667 |
| 0.39146667 | 0.391466667 | 139.8 | 220.2 | 195 | 0.076939203 | 4.785156 | 4.782822 | 0.391466667 |
| 0.39146667 | 0.391466667 | 139.8 | 220.2 | 59.4 | 0.070004769 | 4.785156 | 4.782822 | 0.391466667 |

FIG. 24

| FrameCurrent Element 1 | FrameCurrent Element 2 | FrameCurrent Element 3 | FrameCurrent Element 4 | FrameVoltage Element 1 | FrameVoltage Element 1 |
|---|---|---|---|---|---|
| 2689.59 | 2683.65 | 2678.55 | 2676.2 | 4.76951 | 4.76966 |
| 2689.59 | 2683.65 | 2678.55 | 2676.2 | 4.76951 | 4.76966 |
| 2683.65 | 2678.55 | 2676.2 | 2676.35 | 4.76966 | 4.76974 |
| 2683.65 | 2678.55 | 2676.2 | 2676.35 | 4.76966 | 4.76974 |
| 2678.55 | 2676.2 | 2676.35 | 2685.76 | 4.76974 | 4.77075 |
| 2678.55 | 2676.2 | 2676.35 | 2685.76 | 4.76974 | 4.77075 |
| 2676.2 | 2676.35 | 2685.76 | 2683.85 | 4.77075 | 4.77222 |
| 2676.2 | 2676.35 | 2685.76 | 2683.85 | 4.77075 | 4.77222 |
| 2676.35 | 2685.76 | 2683.85 | 2680.6 | 4.77222 | 4.77661 |
| 2676.35 | 2685.76 | 2683.85 | 2680.6 | 4.77222 | 4.77661 |
| 2685.76 | 2683.85 | 2680.6 | 2681.59 | 4.77661 | 4.77773 |
| 2685.76 | 2683.85 | 2680.6 | 2681.59 | 4.77661 | 4.77773 |
| 2683.85 | 2680.6 | 2681.59 | 2685.26 | 4.77773 | 4.77835 |
| 2683.85 | 2680.6 | 2681.59 | 2685.26 | 4.77773 | 4.77835 |

The Current has Dropped here

FIG. 25

Polarization for 1C, 3C and 6C for 13450 Lithium-ion batteries

| SOC (%) | C (mV) | 3C (mV) | 6C (mV) | 1/6C | Current (mA) | C-Rate | Avg C-Rate |
|---|---|---|---|---|---|---|---|
| 5 | 197.22414 | 118.457317 | 68.3054924 | 0.014640111 | 1639.692447 | 2.522603765 | 4.523188947 |
| 10 | 54.4595718 | 43.3831215 | 34.4600678 | 0.029019096 | 3250.138706 | 5.000213394 | Time |
| 15 | 58.151722 | 48.6135483 | 36.3063812 | 0.027543367 | 3084.857157 | 4.745934088 | 13.26497759 |
| 20 | 58.4597588 | 58.4597588 | 33.8449478 | 0.029546507 | 3309.208826 | 5.091090501 | |
| 25 | 55.9978485 | 45.5369949 | 32.6142311 | 0.030661462 | 3434.083717 | 5.283205719 | |
| 30 | 56.6129684 | 45.5365181 | 32.6142311 | 0.030661462 | 3434.083717 | 5.283205719 | |
| 35 | 58.7673187 | 47.3828316 | 34.1525078 | 0.029280427 | 3279.407788 | 5.045242751 | |
| 40 | 60.6131554 | 49.2291451 | 35.0756645 | 0.028509795 | 3193.097024 | 4.91245696 | |
| 45 | 62.7670288 | 51.6905785 | 37.5370979 | 0.026640312 | 2983.714943 | 4.590330681 | |
| 50 | 64.6128655 | 52.9212952 | 38.4602547 | 0.026000868 | 2912.097202 | 4.480149541 | |
| 55 | 65.2284622 | 54.1520119 | 40.6136513 | 0.024622263 | 2757.693447 | 4.242605303 | |
| 60 | 66.7667389 | 55.0751686 | 42.1524048 | 0.023723439 | 2657.025158 | 4.087731012 | |
| 65 | 66.7672157 | 55.6902885 | 43.3831215 | 0.023050439 | 2581.64918 | 3.971767969 | |
| 70 | 68.3054924 | 54.7671318 | 42.7675247 | 0.023382228 | 2618.809499 | 4.028937691 | |
| 75 | 66.4591789 | 53.2288551 | 41.8448448 | 0.023897806 | 2676.554316 | 4.117775871 | |
| 80 | 64.3057823 | 51.9986153 | 41.5372849 | 0.024074756 | 2696.372678 | 4.148265659 | |
| 85 | 63.6901856 | 50.1523018 | 40.3065682 | 0.024809852 | 2778.703451 | 4.274928386 | |
| 90 | 58.4597588 | 46.7677116 | 37.5370979 | 0.026640312 | 2983.714943 | 4.590330681 | |
| 95 | 54.7671318 | 43.6906815 | 34.7681046 | 0.028761994 | 3221.343281 | 4.955912741 | |
| 100 | 51.99981384 | 41.8448448 | 33.8449478 | 0.029546507 | 3309.208826 | 5.091090501 | |

FIG. 26

ADAPTIVE CHARGING PROTOCOL FOR FAST CHARGING OF BATTERIES AND FAST CHARGING SYSTEM IMPLEMENTING THIS PROTOCOL

CROSS-REFERENCE TO RELATED APPLICATIONS

This application is a national phase entry under 35 U.S.C. § 371 of International Patent Application PCT/IB2018/059756, filed Dec. 7, 2018, designating the United States of America and published as International Patent Publication WO 2019/162750 A1 on Aug. 29, 2019, which claims the benefit under Article 8 of the Patent Cooperation Treaty to Singapore Patent Application Serial No. 10201710151Y, filed Dec. 7, 2017.

TECHNICAL FIELD

The present disclosure relates to an adaptive charging protocol for fast charging batteries. It also relates to a fast charging system implementing this protocol.

BACKGROUND

"How to charge a battery faster?" is a question that was not fully answered for several decades since the inception of battery storage devices. More importantly charging a lithium-ion battery faster has become a critical concern due the rapid and massive use of mobile device technologies and the increasing demand on the electric vehicles (EVs) and plugin electric hybrid vehicles (PHEVs) in recent years due to the urgency to curb the air pollution caused by petroleum-dominant vehicles. Therefore, a fast charging solution for a Lithium-Ion battery in today's world is a billion-dollar worth innovation.

The aim of the present disclosure is to propose a new charging protocol, which allows fast charging for batteries with improved performances compared to present fast-charging technologies.

BRIEF SUMMARY

This aim is achieved with an adaptive charging protocol (ACP) implemented for fast-charging a rechargeable battery having electrode terminals connected to terminals of a power supply provided to apply time-varying voltages to the electrodes, the protocol comprising, before starting a charging operation for the battery, the steps of:
  detecting the existence of historical data on previous charging operations for the battery,
  in case of detection, processing the historical data to adjust charging parameters in view of optimizing the charging operation;
  in absence of detection, electrically testing the battery to get data on variations of the state of charge (SOC) for the battery, in view of building a learning model on the SOC variations to be used for optimizing the charging operation.

The adaptive charging protocol may further comprise a step of detecting battery system requirements and a step of processing the battery system requirements in view of optimizing the charging operation.

An adaptive charging protocol (ACP) for fast charging lithium-ion battery was developed to charge a battery in about 10 minutes time. This is a combination of two fast charging methods that can be applied to any type of battery. It works as memory-less charging model as well as a memory-based charging model. If the historical data about the battery chemistry is available, this protocol automatically gest adjusted to make use of them to provide the best charging performance. If it happens to charge a random battery, without any historic or specific data, a quick learning model about its ΔSOC will be fair enough to charge it quickly and safely. Not only that, it will also consider about the user's requirements and some system requirements (as and when it detects them) when adjusting its protocol for charging. Therefore, this can also be considered as a universal protocol to fast charging batteries.

Within this protocol, three different methods of fast charging have been explored
  ACP based on Non-Linear Voltammetry (NLV)
  ACP based on the Inverse of Polarization (IP)
  ACP based on both the NLV and IP, depending on the adaptive circumstances.

When the adaptive charging protocol implements a Non-Linear Voltammetry (NLV) method, the charging operation comprises the following steps:
  a Linear Sweep Voltammetry (LSV) step, for a short duration, the LCV step comprising an analysis of current and voltage on the battery terminals,
  a series of successive Non Linear Voltammetry (NLV) steps, each NLV step being assigned a next-set voltage and being followed by a relaxation step for a relaxation time during which no voltage and/or no current is applied to the batteries terminals, the series of NLV step continuing until at least one exit-charging criterium among a group of exit-charging criteria is reached.

The next set voltage is computed from the following equation:

$$K_n = \frac{dV}{dt}\left(\left|\frac{dI}{dt}\right|\right)^\alpha$$

Where: $K_n$ is a constant value for a certain period during charging, $$\frac{dV}{dt}(V/s)$$

is a rate of change of cell Voltage V during the charging process/the step time duration, $$\left|\frac{dI}{dt}\right|(mA/s)$$

is the absolute value of a rate of change of charging Current I during the charging process/the step time duration,
  $\alpha$ is a coefficient comprised between 0.1 and 100.

The relaxation time can be determined depending on the state of charge (SOC) of the battery.

The adaptive charging protocol may further comprise a step for training the K-value based on examining the charging current drawn by the battery versus an expected C-Rate current for the battery.

Exit-charging criteria may comprise reaching a Target End Voltage (tev).

Exit-charging criteria may comprise reaching a predetermined level of gained state of charge (SOC) based on a Coulomb counting.

Exit-charging criteria comprise determining pattern matching of a Current profile based on artificial intelligence.

When the adaptive charging protocol implements an Inverse of Polarization (IP) method, the charging operation comprises the step of:
- analyzing a polarization profile of the battery to be charged,
- calculating a profile for the current to charge from the power supply into the battery in view of compensating less polarized zones within the battery, The expected current to charge may be computed using the following equation:

$$I(\Delta SOC) = M(\acute{\eta})\beta$$

Where:
$\Delta SOC$ is the gain in state of the charge for the battery at any time,
M is a constant for a certain range of gains $\Delta SOC$, based on the $\Delta SOC$ and the battery type,
$\eta$ is the inverse of polarization in different $\Delta SOCs$, and
$\beta$ is a constant for the battery, determined by polarization data.

The adaptive charging protocol can further comprise a plurality of relaxation steps with predetermined relaxation durations, during which no voltage and/or no current is applied to the battery terminals.

The adaptive charging protocol can implement both Non-Linear Voltammetry (NLV) and Inverse of Polarization (IP) charging methods, and then implementation of one method among the NLV or IP charging methods is dynamically decided depending on adaptive requirements issued from the battery system and/or on information on State of Health (SOH) issued from the battery system and/or on calculated data on the variations $\Delta SOC$ in the State of Charge (SOC) of the battery.

The adaptive charging protocol can be implemented for charging a rechargeable battery among a group comprising lithium-ion batteries, nickel-metal hydride batteries (NiMH), nickel-cadmium batteries (NiCd), lead acid batteries (LAB) and sodium-based batteries (NaS, NaNiCl2).

According to another aspect of the present disclosure, a system for fast-charging a rechargeable battery is proposed, the battery having terminals connected to internal electrochemical cell electrodes and an initial state of charge (SOCi), the fast-charging system comprising:
- a power supply positioned in electrical communication with the electrodes for providing a controllable time varying charging voltage applied to the battery terminals, thereby generating a charging current resulting in charging of the electrochemical cells from the initial state of charge (SOCi) to a state-of-charge target value (SOCf),
- a charging-control processor for controlling the power supply, wherein the charging-control processor is programmed for:
- detecting the existence of historical data on previous charging operations for the battery,
- in case of detection, processing the historical data to adjust charging parameters in view of optimizing the charging operation;
- in absence of detection, electrically testing the battery to get data on variations of the state of charge (SOC) for the battery, in view of building a learning model on the SOC variations to be used for optimizing the charging operation.

The charging-control processor can be further programmed for processing battery system requirements in view of optimizing the charging operation.

The charging-control processor is further programmed to implement a Non-Linear Voltammetry (NLV) method.

The charging-control processor is further programmed to implement an Inverse of Polarization (IP) method.

The charging-control processor can be further programmed to implement both Non-Linear Voltammetry (NLV) charging and Inverse of Polarization (IP) charging, and dynamically decide on which charging method to be implemented, depending on adaptive requirements issued from the battery system and/or on information on State of Health (SOH) issued from the battery system and/or on calculated data on the variations $\Delta SOC$ in the State of Charge (SOC) of the battery.

The fast-charging system can be provided for charging a rechargeable battery among a group comprising lithium-ion batteries, nickel-metal hydride batteries (NiMH), nickel-cadmium batteries (NiCd), lead acid batteries (LAB) and sodium-based batteries (NaS, NaNiCl2)

According to another aspect of the present disclosure, there is proposed a controller for controlling a system for fast-charging a rechargeable battery from a power supply, the battery having terminals connected to internal electrochemical cell electrodes and an initial state of charge (SOCi), programmed for:
- detecting the existence of historical data on previous charging operations for the battery,
- in case of detection, processing the historical data to adjust charging parameters in view of optimizing the charging operation;
- in absence of detection, electrically testing the battery to get data on variations of the state of charge (SOC) for the battery, in view of building a learning model on the SOC variations to be used for optimizing the charging operation.

The fast-charging controller can be further programmed to:
- process battery system requirements in view of optimizing the charging operation.
- implement a Non-Linear Voltammetry (NLV) method.
- implement an Inverse of Polarization (IP) method.
- implement both Non-Linear Voltammetry (NLV) charging and Inverse of Polarization (IP) charging, and to dynamically decide on which charging method to be implemented, depending on adaptive requirements issued from the battery system and/or on information on State of Health (SOH) issued from the battery system and/or on calculated data on the variations $\Delta SOC$ in the State of Charge (SOC) of the battery.

An adaptive charging protocol (ACP) has been proposed for fast charging rechargeable batteries including, but is not limited to lithium-ion batteries, nickel-metal hydride batteries (NiMH), nickel-cadmium batteries (NiCd), lead acid batteries (LAB) and other sodium-based batteries (NaS, NaNiCl2). This protocol can be used to charge a battery in about 10 minutes time and to pick the best method for charging based on its change in state of charge ($\Delta SOC$) and on its state of health (SOH).

BRIEF DESCRIPTION OF THE DRAWINGS

These and other features and advantages of the present disclosure will become better understood with regards to the following description, appended claims, and accompanying drawings wherein:

FIGS. 24 and 25 are tables that provide a close examination of A and B segments in FIG. 19; and FIG. 26 is polarization data for 1 C, 3 C, and 6 C for 13450 lithium-ion batteries.

DETAILED DESCRIPTION

Figure 1:
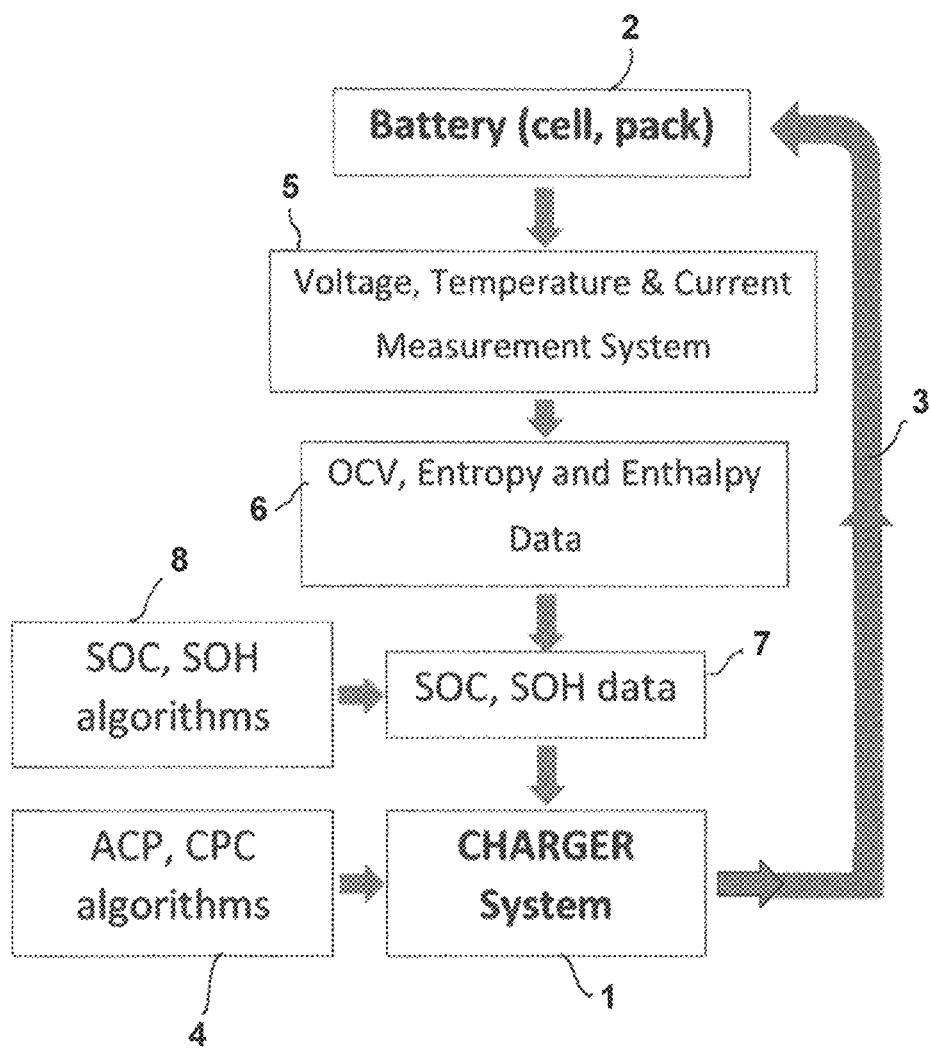
FIG. 1 is a functional scheme of a fast-charging system implementing the adaptive charging protocol according to the present disclosure.

With reference to FIG. 1, a charger system 1 is provided for charging for charging a battery (cell, pack) 2 via an electric connection 3. The charger system 1 implements an Adaptive Control Protocol (ACP) algorithm or a Cascade Pulse Charging (CPC) algorithm 4. The battery 2 is monitored by a measurement system 6 for measuring Voltage, Temperature and Current. From these measurement, Data 6 on Entropy, Enthalpy and Open-Circuit Voltage (OCV) are calculated and then processed by means of SOC, SOH Algorithms to deliver Data 7 on State of Charge (SOC) and State of Health (SOH) of the battery 2. SOC and SOH Data 7 are processed by the charger system 1.

The general ACP protocol according to the present disclosure leads to three charging protocols methods:
  ACP based on Non-Linear Voltammetry (NLV)
  ACP based on the Inverse of Polarization (IP)
  ACP based on both the NLV and IP, depending on the adaptive circumstances.

ACP based on Non-Linear Voltage (NLV)

Using this method, a battery can be fully charged in about 10 minutes' time. In average cases, it will charge the battery in about 22-24 minutes time. Through a cyclic test, it has proven that this charging protocol hasn't largely impacted on the capacity fading. Further, this could be a model for fast-charging any type of battery as the basis of this protocol is to let the battery charge with its' own favorable current at any point of time, depending on its ΔSOC and SOH.

Adaptive charging, Non-Linear Voltage changing, and Relaxation are the key cornerstones of this protocol. Adaptive charging allows the system to balance the charging based on the user's time requirements, required charge capacity and the SOC and SOH of the battery. Non-linearly changing the voltage coupled with a suitable relaxation pattern allows this method to gain the maximum charge capacity without straining the battery.

As the cell impedance increases toward the end-of-discharge (EOD) [1], the protocol uses either a high-speed NLV steps or a configurable constant current (CC) charge at the starting SOC. If the system couldn't reach the expected charge at the end of the NLV-based charging, the adaptive protocol will decide whether to get use of another CC charge to gain the balance capacity. Following summarizes the NLV charging:

A. The NLV-based charging starts with a very short Linear Sweep Voltammetry (LSV) step. LSV duration is configurable (e.g., 10 minutes) to speed-up the battery charging at the start. The time used with LSV will be a few seconds (e.g., 8 seconds).

B. With the LSV charging Current and Voltage analysis from the above step, the first NLV step will start. This is entirely based on the following equation:

$$K_n = \frac{dV}{dt}\left(\left|\frac{dI}{dt}\right|\right)^\alpha$$

where
V=celT voltage (V), 1=charging current (A), t=time (s)
a>1, n>0, dt>0.1 second
Kn>0, change with state of charge (SOC): 0< Kn(SOC)<200.

Accordingly, the next-set voltage can be found through this equation.

C. Then the subsequent NLV steps will continue until the Exit-Charging criteria is made:
  Equation (1) will be used to calculate the Next-Set-Voltage after every step. Then, let the battery charge on that Voltage for a short "step-time (st)." Then, do a relaxation. This will be iterated until the battery is fully charged as per the users' target.
  The relaxation time (rt>0.1 s) will vary based on the SOC. During lower SOCs, "rt" is decided merely by dI/dt (based on how good the battery draws high current), and at higher SOCs, a frequent short relaxation is set irrespective of the dI/dt.

The "step time (st>0.1 s)" will vary based on how good or bad the battery response (with a current) to a certain voltage. Based on experimental data: ls<st<60 s.

The drawn current will be examined versus the expected C-Rate current and move into the next step whenever it fails to make it. The "K" value will be trained based on these outcomes. The relaxation applied after every step-time based on the SOC.

Managing the "Target End Voltage (tev)" is the primitive key to decide when to stop charging [4.2V<tev<6V]. Based on experimental data, 4.400 V<tev<4.855 V.

The system will adjust this based on the current drawn when a "tev" is reached. Coulomb counting based Gained SOC is another criterion to exit from NLV. Pattern matching of Current profile is another way (AI based) to decide the exit.

ACP based on the Inverse of Polarization (IP)

This method intends to analyze the polarization profile of the type of the battery to be charged. Accordingly, it can automatically calculate what sort of a current profile to be maintained during charging to fast charge the battery compensating the less polarize zones.

The following equation will be used to derive the expected Current to charge using this method:

$$I(\Delta SOC) = M(\acute{\eta})\beta$$

ΔSOC: This is the gained capacity at any point of time (0%<=ΔSOC<=100%).

M: This is a constant factor for a certain range of ΔSOC, but it can change based on the ΔSOC and the battery type.

η: This is the inverse of polarization in different ΔSOCs.

β: This is a constant for a battery and determines by the polarization data.

ACP based on both the NLV and IP

This is a hybrid method that consists of both the above methods. Use of NLV or IP or a combination of it will be defined by the adaptive charging requirements given to the system. In some SOH situations, the IP-based method will not be suitable, but the NLV method will be promising.

But, in some other situations, the IP-based method will make faster charging over NLV. So, the use of which method at what time is totally dynamic and decided based on the available circumstances. Therefore, having an accurate ΔSOC calculation will be important to use this effectively.

ACP based on Non-Linear Voltammetry (NLV)

This adaptive charging protocol (ACP) is based on non-linear voltammetry-(NLV-) based control over the period of charging a battery. It allows the battery to charge at an acceptable Current (Amps) amount at different Voltage levels based on its own state of health (SOH) and state of charge (SOC). Therefore, the amount of Current draws into the battery is never controlled or imposed by this protocol at any time.

Even it is predictable that a battery can be charged (more than 80%) in less than a 25 minutes using this method, it can get elongated or shortened based on the health (SOH) of the battery at the time of charging. It also assures better safety compared to the other fast charging methods [2, 3, 5], which are mostly imposing the High-Current (I) in different patterns/wave forms. So, most importantly this ACP method does not strain the battery by drawing a large fixed-load of electrons through the cells without taking its health into consideration.

The equilibrium in kinetics of battery-particle dynamics, such as lithiation/de-lithiation (intercalation/de-intercalation), shooting/floating the ions/electrons through the solvents and separators, transporting charge against the internal impedance (IR) etc. [4, 6], determine how healthy the battery is/how much of a Current can be taken/given by the battery-system at a time, during charging/discharging. It is believed that this equilibrium can be expressed as a relationship between the "Rate of the change, in Current (dI/dt)" and the "Rate of the change, in Voltage (dV/dt)." Therefore, the following relationship was used in forming up this protocol:

$$K_n = \frac{dV}{dt}\left(\left|\frac{dI}{dt}\right|\right)^\alpha$$

where:

Kn: "K-value" is a constant for a certain period during charging.

n>=0

$\frac{dV}{dt}$ (volts/secs):

This is the rate of the change of Voltage (V) during the charging process [(Vstep-end−Vstep-start)/Step-Time Duration], $\left|\frac{dI}{dt}\right|$ (mA/secs):

This is the rate of the change of Current (I) during the charging process in absolute value.

α: is an adjustable coefficient 100>α>0 and it makes the room for this equation to seek the non-linear relations between Current and Voltage based on different types of battery. This will also be trained by the system to best suit the charging process.

Further, the relationship for α=1 can be simplified as:

$$K_n = \frac{dV}{dt}\left|\frac{dI}{dt}\right|$$

From the literature of Li-ion batteries, it is evident that the chemistries of the battery provide inherent characteristics on the voltage profiles. Within certain lower voltages (with low SOC), the cell's tend to draw a very low Current (due to high impedance) whereas in higher voltages (high SOC with lower polarization) the potential of drawing High Current is remarkably high [1]. Some cells have a very narrow frame of a Voltage-range where these High Currents could be tolerated. So, the fast charging should be applied to keep the battery in these ranges for a longer time, as much as possible, until the expected capacity (as much capacity as possible before the tolerable current drops below a certain lower level, which would elongate the total charge time) is gained during the charging process.

All examples given below are related to lithium ion batteries. However, ACP applies to all types of rechargeable batteries including, and not limited to NiMH, NiCd, LAB, alkaline cells, NaS, NaNiCl2, redox flow (ZnBr, VRB), etc.

The "ACP on NLV" is meant for an Adaptive Charging Protocol (ACP) based on Non-Linear Voltammetry (NLV) charging. It is adaptive as the protocol adapts to several user-driven and system/battery-driven factors to adjust its own charging profile to better response to the given charging requirements. The user expected charging time (duration), expected percentage of charge (100%, 80% or 60% etc.), possible relaxation time and initial state of charge (SOC) are some of the user driven factors of the adaptation process. Identifying current SOC has also designed to be processed automatically using the entropy and enthalpy-based method, which comes as a system/battery driven factor as well. The state of the health (SOH), stated (nominal) capacity, safety voltage range, available accuracy of voltage control and polarization profile of the battery are some of the automatically detected/system driven factors.

During NLV charging, the battery cell set to a certain voltage (CV), which is non-linearly changing and gradually increasing at every step. Therefore, the battery is charged based on Non-Linear-Voltage (NLV) for a period over a series of quick charging steps.

During each of these steps, the cell draws a certain amount of Current based on both of its State of Charge (SOC) and State of Health (SOH) at the very specific time. Then the Current will gradually drop down. How fast the current drops at a certain step provides some clue on how good or bad the battery would like to stay in that NLV step. This way, one can allocate more step-time whenever the battery is keen to draw more Current, and less step-time when it attempts to drastically drop its drawing Current.

After every step, a very short relaxation with zero (0) Current is applied to the system to stabilize with its new charge and thus the OCV will drops to its stable (or almost stable) level. This creates a better chance [7, 8] for the next NLV charge-step to gain the optimal Current based on its status without imposing a high current beforehand. In this way, the protocol trains the cell to be stable and healthy (as much as possible, also without wasting much time on too long relaxation) after every step and better prepare it for the next step to gain more current than if it was done without the relaxation. But, if the amount of current-drop is not significant for a certain step, the system allows to stay longer in that step without moving to the next step. In this case, the rate of current-drop and a maximum allowed time for such continuation of a step is monitored to decide the time to move to the next step.

The system decides the "maximum allowed time for such continuation of a step" based on adaptation parameters. So, whenever a rapid drop of the current or exceeding of the "maximum allowed time for a step" is detected, the system moves to the next charging step. Therefore, the actual time it takes for a full-charge depends on both the SOC and SOH of the battery.

Further, the charging system takes three parameters to determine the end of charging. First, if the battery is fully charged based on the stated and gained capacities. The Second is if the maximum-target-end-voltage is reached. The "target-end-voltage" is adjusted automatically by the system based on the polarization data of the relevant battery type/chemistry. The Third, and optional, factor is a self-learning model of the charging profile to determine the state of charge based on the real-time parameters at the time (by examining for a certain window of time) of charging.

FIG. 1 shows a profile of Current and Voltage during the NLV charging process. Some steps have taken longer time staying in the same voltage compared to the others. Mostly these steps draw more Current without drastically dropping over-time. So, the system is more stable and has the potential to accept more current and transport more charge within the cell. In addition, it is also clear, at the beginning, each voltage-step has given a very short duration and rapidly changed until it starts drawing some high-current. This is also a good example of battling against the high polarization at the lower SOCs [9, 10].

Also, a frequent relaxation has applied during this period. Similar situation can be seen at the end where the steps were frequently changed with multiple-relaxations, this is when the Drawn High Current is not that stable and tend to drop very rapidly.

Figure 2:
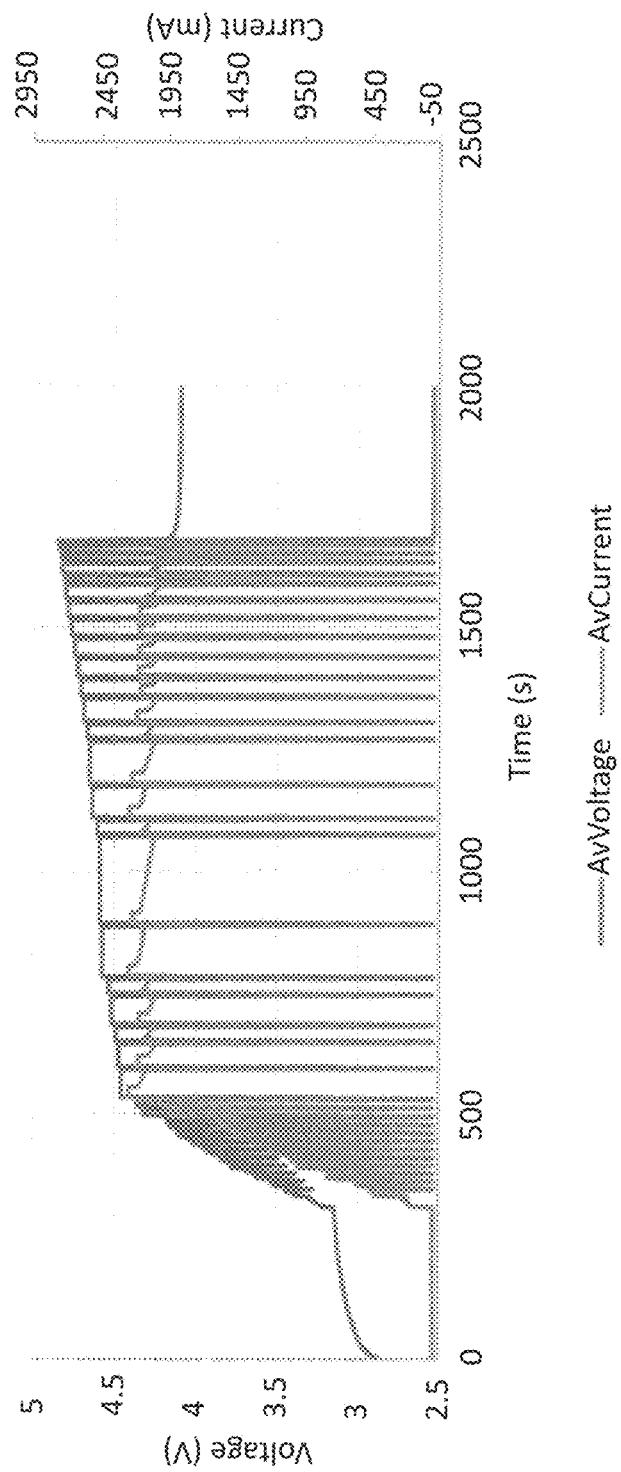
FIG. 2 illustrates Voltage and Current Profiles of a NLV-based Charging Process.

FIG. 2 shows the NLV-based charging process as a flow diagram of important processes. Followings section will explain the details of each of these main processes.

[A] Discovery of Initial SOC

This is an optional process as the system depends on the SOC gain. Having this measured using any external methods will also help the system to improve its performance.

Figure 3:
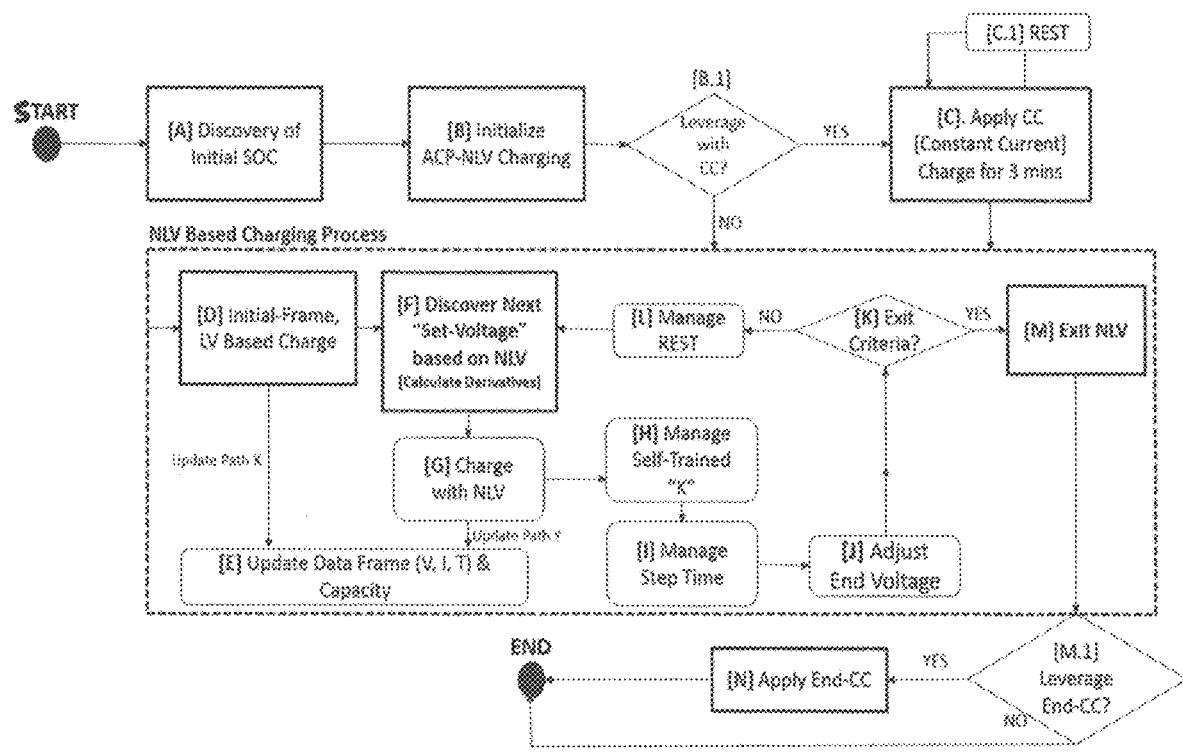
FIG. 3 Illustrates an ACP-NLV Charging Protocol: Process Flow.
Figure 4:
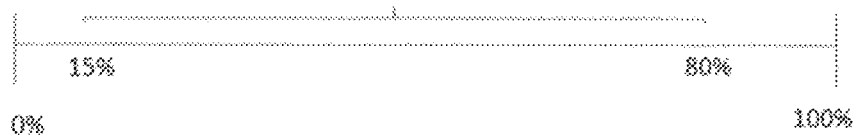
FIG. 4 is a Potential range of Initial SOC.

Therefore, several methods have been explored to determine the initial SOC. The thermodynamic-based SOC prediction using fuzzy logic is one of the accurate and faster methods, which have been identified. Some other potential methods can also be found in literature [11, 12]. So, the system not only caters the charging from 0% (SOC) to 100% (SOC) but also supports any partial charging. This initial SOC (if available) can also be used to determine the initial "K" value, with reference to FIG. 3.

[B] Initialize ACP-NLV Charging

Initialization parameter of this protocol can be categorized in to two main sections:

1) User Preference Parameters
   a) Expected Time-Duration (ETD) for charging: whether to charge in 15 minutes or 30 minutes, etc.
   b) Enable Constant Current [CC] Leverage: Opting this will enforce the system to use CC-based leverage before applying the NLV-based charging. But this is optional. The default current for this CC-Charge is 3 C and the time duration is 3 minutes. But those are configurable.
2) System Parameters
   a) start Voltage: the OCV of the battery just before charging starts.
   b) nlvStatedCapacity (SC): the manufacturer defined/experimentally proved capacity of the battery. This will be used to calculate the C-Rate.
   c) nlvStepInterval (CST): the duration of a 1 step of charging/nlv charging. The NLV Charging models through a series of short steps. During each step, the next expected voltage is calculated, charged and update the relevant parameters.
   d) nlvStepsPerFrame (CFS): the number of steps to be considered as a Frame.

The Frame is a set of adjacent steps bundled-up to apply some mathematical formulas (average derivative of I and V) to determine the next potential Voltage. The entire frame will be filled for the very first time by a series of known LV-based charging steps equivalent to the number of steps within a frame (CFS). Subsequently, after every step (CTS), only the last element of the frame will be updated with the new data and all the other elements will be shifted one place backward, making the first element discarded. This will be carried-out during the entire charging process.

e) frameCurrentArr: the frame array of currents, which will get updated after every step-time (CTS) duration.
   f) frameVoltageArr: the frame array of currents, which will get updated after every step-time (CTS) duration.
   g) nlvInitialSlopeDuration: this is the time duration taken for the Linear Voltammetry- (LV-) based charging.

h) lvEquation: the linear equation, which is used to generate the LV values for the very first stage [to fill up the first Frame] of NLV charging.
i) nlvEndTargetVoltage: the End voltage for the LV-based charging calculations. This is 4.2V by default.
j) nlvInitVoltArr: the voltage array of frame-size (CFS) with LV-based voltage steps.
k) nlvKValue: the first/default Kn value to start with [supposed to be predefined by the LV-based analysis on the battery]. Later, this will be trained by the system to support faster-charging.
l) minVoltage and maxVoltage (Vmax, Vmin): the min/max voltages supported by the system for safety purpose.
m) cRateRealTime: based on the drawn current, the real-time C-Rate will be measured: e.g., C-Rate=Current/nlvStatedCapacity
n) cRateMinExpected: the minimum required C-Rate to expect if the system is to fully charge in ETD time defined above.
o) cRateDrop Threshold: this is the "Considerable drop of Current" that will be allowed within a single Voltage-step. If the C-Rate drops below this threshold, the system shifts to the next step.
p) nlvElapsedChargeTime: [nlvECT] is the time duration taken for charging at any given time.

[C] Apply CC [Constant Current] Charge for 3 minutes

If this mode is opted, a 3 C Constant Current (CC) will be applied for a shorter period to leverage the battery toward fast-charging. The default period is 3 minutes, but both the CC current and this short period is configurable.

While CC charging, a relaxation [C.1 REST, "0" current for a 1 step-time (CTS)] is applied after every tenth step. Once, the CC-based charging is completed, a longer relaxation (3 CTS) is applied before moving to the next Process.

[D] Initial-Frame. LV-Based Charge

This step is used as the initialization/kick-start process for NLV charging. For the NLV process to calculate the next-non-linear-set-voltage, a frame of Current and Voltage values is required. Therefore, as a starting point, some other methods are needed for a very short period (1 frame duration) to charge the battery. This will also gain some capacity that will push the battery away from the lower SOC stages where a high polarization is hindering the fast charging.

Therefore, any of the following methods are suitable for this kick-start:

Linear Sweep Voltammetry- (LSV-) based charging
Linear Sweep Amperometry- (LSA-) based charging.

To simplify the explanation, LSV has been used as the kick-start method:

1. Read the Start-Voltage (V start) of the battery, after the above relaxation.
2. Read the expected initial End Voltage (V init-end) of the battery.
   This is set to gain more range in high voltage without harming the battery.
3. Use Linear Voltammetry (LSV) and get an array [array-lv] of voltage elements to start the charging process.

$$V_{next} = V_{start} + \text{time-interval} * V_{slope}$$

V slope was taken as to charge the battery in 20 minutes time [if ETD=20 minutes]
4. Define the following configuration parameters:
   a. Measure Interval (ts)
   b. Step Interval (dt) [CTS by default]
   c. Number of Steps per Frame (frame-size, CFS)
   d. Stated capacity (Capacity-stated)
   e. Maximum Voltage allowed (V max-end)
   f. VoltageFrame array size of "frame-size"
   g. CurrentFrame array size of "frame-size"
5. Take a frame of steps from the LV array
   Select a sub-array of "frame-size" elements from "array-lv" as defined in step 3.
6. Start applying Linear Voltammetry-based charging through "array-lv-" based voltage series, just for a 1 frame of duration. Measure current and voltage at each step and fill into the relevant Frame-arrays. These will be used to calculate the Slope of Change in Current and Voltage.

[E] Update Data Frame (V. T T) and Capacity

Updating the Voltage (V), Current (I), and Temperature (T) should be done after every step. Therefore, for each step, the update is taken place just before triggering the next step. So, the current taken to calculate the Capacity gain is the minimum current during that CTS time frame (2 seconds in default case). Further:

From "Update Path X," every time the incoming/new reading will be stored as the next-element in the frame. As the "process D" will be continued only for CFS number of times, the frame will be completely filled with the completion of the "process D."

From "Update Path Y," every new/next reading will be stored as the last element of the frame. All its previous data will be pushed back from 1 position. So, every time the very first item of the frame will be wiped-off.

VoltageFrame and CurrentFrame arrays will be filled to store the frame values and will be continuously updated during the charging process.

Figure 5:
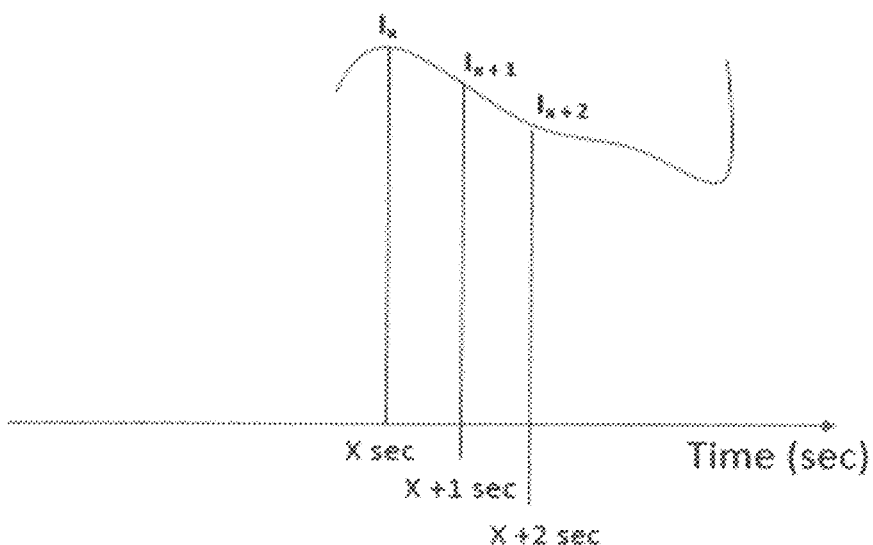
FIG. 5 illustrates a segment of Current Variation.

Updating the Capacity:

A simple method to calculate the SOC (%) at time t is to use the Coulomb counting in real-time:

$$SOC(t) = SOC(0) + 100x \frac{\int_0^t I(\tau)d\tau}{Q_{nom}},$$

where
SOC(0) is the initial SOC at t=0, $Q_{nom}$ is the cell nominal capacity, $I(\tau)$ is the time dependent current and "dt" is time duration of a step, with reference to FIG. 5.

The default "Step-time" has set as 2 seconds. So, whenever some Current draws by the battery, the relevant capacity gain will be calculated based on the above equation (C=Ixt: Current×Time). Then it will be updated to the main capacity-gain. This will be used in the protocol to define the SOC, and subsequently to control over the parameters for changing SOC.

There is no capacity calculation during a relaxation step.

[F] Discover Next "Set-Voltage" based on NLV [Calculate Derivatives]

1. Use the VoltageFrame and CurrentFrame arrays for the following calculation and define the "Next-NLV-based-Voltage (V-nlv-next).
   a. Calculate the Average of the derivatives of the Current (d[I]/dt (mA/seconds)) for the running Frame
   b. Take the last Voltage from the "VoltageFrame" ("V-nlv-prev")
   c. Define the "K-Value"
      i. For the very first time, this will be a predefined value based on the LV analysis for a 20 minutes (ETD) LV charge on this type of battery ii. For the subsequent processing, the system will train the "K-Value" based on a set of parameters (such as drawn C-Rate, rate of current drop within a step, SOC and etc. This will be described under the section on "Manage Self-Trained "K")."

d. Define the V-nlv-next as below:

$$V\text{-}nlv\text{-}next = V\text{-}nlv\text{-}prev + K\text{-}Value * [\{1/(d[I]/dt(mA/\text{seconds}))\} * dt]$$

e. Examine the previous NLV-step to identify whether there is a current drop or an increment, and if there is a drop (Idrop=[(lx+1 −lx)/lx)]) then apply voltage compensation to reduce the rate of next voltage ramp.

$$V\text{-}nlv\text{-}next = V\text{-}nlv\text{-}next - Idrop * (V\text{-}nlv\text{-}next - V\text{-}nlv\text{-}prev)$$

2. T, Temperature will also be used to ensure the safety of the battery during charging.

Whenever the temperature rises above the safety limit, the charging will be kept on hold and the system relaxed for a predefined amount of time duration until resumed, when the expected temperature range is secured.

[G] Charge with NLV

1. Set the "V-nlv-next" to the battery
   a. Read the Current (realtimeCurrent) and Voltage (realtimeVoltage) soon after this setting.
   b. Read Current and Voltage after "Step Interval".
   c. Average the above two and update the last entry of the VoltageFrame and CurrentFrame.
2. Read the drawn current soon after setting the V and compare for safety limits to avoid any damages in case of any unexpectedly high current. Otherwise, wait for the CTS duration until the next ""NLV-Set-Voltage" is set. There is no enforcement on the Current. The system only measures the Current and Voltage at its finest possible frequency.

[H] Manage Self-Trained "K" and GI1 Manage Step Time $$K_n = \frac{dV}{dt}\left(\left|\frac{dI}{dt}\right|\right)^\alpha$$

Above equation is used to determine the NLV-based Set Voltage at every single charge step. But the Kn is also changing based on a set of factors. Following are the main factors used to control it:

"Expected C-Rate: cRateExpected" to ensure fully charge, achieving the required amount of Capacity, within the Required time-duration.

Based on the users' preference/requirement on the "Charge Time" and the "Charge Capacity," the system can calculate the minimum C-Rate ("Expected C-Rate") that has to be maintained continuously or as the average during the entire period of charging. The protocol uses this information to control over the Kn and step time by comparing it with the C-Rate ("Real time C-Rate: cRateRealTime (CRRT)") driven by the real-time-current in every charge step.

Whenever a high "Real time C-Rate" is drawn, the Kn kept as low as possible. And the Step-Time increases as much as possible. At the same time, it will not allow the "Step-Time" to exceed "maximum allowed time for a step" without applying the relaxation. But, if the system draws a high "Real time C-Rate" even after a relaxation, it allows the same Voltage-Step to continue until a "Considerable drop of Current" (this is a configurable parameter by the system) is identified. Then it will decide to move to the next voltage step.

"Elapsed Charge-Time: timeElapsedCharge" to ensure that the required charging is achieved within the expected time duration.

This will also work as a factor of the state of charge (SOC). When it reaches the end segments of the expected charging duration, the system will increase the charging frequency by reducing the Step-time and increases the Kn to a higher value to rapidly sweep through the non-linear voltage change.

But if the system draws a current of nearly or within the range of "Expected C-Rate," the system will keep a nominal range of step-time and Kn value.

"C-Rate draining duration: timeWaitedForExpectedCRate" to try and push the system to get out of such high-resistant charging windows.

Whenever the system detects that the drawing Current at a certain Voltage step is way below the "Expected C-Rate" threshold, it will try to pass through that steps as quickly as possible. Therefore, the "Step-Time" will be reduced.

But, if this occurs at the very initial stage (at Low SOC), the Kn value will be largely increased to step-up the voltage from a large amount.

If it occurs toward the end of charge, the Kn value will kept at a moderate level as the can still have to charge to gain more capacity. Here the expectation of the C-Rate" can drop down to a half of its full expectation as well.

When the "Step-Time" is reduced in this case, the system tries to speed-up sweeping through charge steps. So, in some cases, the drawn Current may again rise-up. But on other cases, it may remain at a lower C-Rate. In such lower cases, the Kn value will be set to a very high value until a considerably acceptable level of Current could be drawn by the battery. Whenever it start-back drawing high C-Rate current, the Kn value will be lowered, yet the "Step-Time" kept small to pass through this difficult period as fast as possible while gaining the maximum possible charging even within that period.

The control logic and the reference table, which were used for the reference protocol based on the above claims, are as follows:

TABLE 1.1

Reference Table for different levels of "cRateExpected"

| Expected C-Rate Threshold levels | Value | Value for the Reference Protocol shown in this write-up [cRateExpected = 3C, to charge in 20 mins] |
|---|---|---|
| cRateExpectedO5 (CREO5) | cRateExpected + 80% * 1C | 3.6 C |
| cRateExpectedO4 (CREO4) | cRateExpected + 60% * 1C | 3.6 C |
| cRateExpectedO3 (CREO3) | cRateExpected + 30% * 1C | 3.3 C |
| cRateExpectedO2 (CREO2) | cRateExpected + 10% * 1C | 3.1 C |

TABLE 1.1-continued

Reference Table for different levels of "cRateExpected"

| Expected C-Rate Threshold levels | Value | Value for the Reference Protocol shown in this write-up [cRateExpected = 3C, to charge in 20 mins] |
|---|---|---|
| cRateExpectedO1 (CREO1) | cRateExpected | 3.0 C |
| cRateExpectedL1 (CREL1) | cRateExpected − 50% * 1C | 2.5 C |
| cRateExpectedL2 (CREL2) | cRateExpected − 90% * 1C | 2.1 C |
| cRateExpectedL3 (CREL3) | cRateExpected − 130% * 1C | 1.7 C |
| cRateExpectedL4 (CREL4) | cRateExpected − 150% * 1C | 1.5 C |

TABLE 1.2

Reference Table for different levels of "nlvKValue_TrainedFactor"

| NLV K-Value Training Factor Levels [Trained K Value = k_T] | Value | Trained_KValueValue for the Reference Protocol shown in this write-up [cRateExpected = 3C, to charge in 20 mins] Default K = 6.4322, "trainedKVaue" as "K" below. |
|---|---|---|
| nlvKValue_TrainedFactorL1 (k_TFL1) | 1/16 | K = 0.4020125 |
| nlvKValue_TrainedFactorL2 (k_TFL2) | 1/14 | K = 0.459442857142857 |
| nlvKValue_TrainedFactorL3 (k_TFL3) | 1/12 | K = 0.536016666666667 |
| nlvKValue_TrainedFactorL4 (k_TFL4) | 1/10 | K = 0.64322 |
| nlvKValue_TrainedFactorL5 (k_TFL5) | 1/9 | K = 0.714688838888889 |
| nlvKValue_TrainedFactorL6 (k_TFL6) | 2/3 | K = 4.288133333333333 |
| nlvKValue_TrainedFactor (k_TF) | 1 | K = 6.4322 |
| nlvKValue_TrainedFactorH1 (k_TFH1) | 3/2 | K = 9.6483 |
| nlvKValue_TrainedFactorH2 (k_TFH2) | 9 | K = 57.8898 |
| nlvKValue_TrainedFactorH3 (k_TFH3) | 27/2 = 13.5 | K = 86.8347 |
| nlvKValue_TrainedFactorH4 (k_TFH4) | 18 | K = 115.7796 |
| nlvKValue_TrainedFactorH5 (k_TFH5) | 81/4 = 20.25 | K = 130.25205 |
| nlvKValue_TrainedFactorH6 (k_TFH6) | 45/2 = 22.5 | K = 144.7245 |

TABLE 1.3

Reference Table for different ieves of "timeWaitedForExpectedCRate"

| The "timeWaitedForExpectedCRate" Levels [t_WFECR] | Number of Steps | Value for the Reference Protocol shown in this write-up [cRateExpected = 3C, to charge in 20 mins] 1-Step Time = 2 secs |
|---|---|---|
| timeWaitedForExpectedCRate_1 (t_WECR1) | 5 | 10 secs |
| timeWaitedForExpectedCRate_2 (t_WECR2) | 8 | 16 secs |

TABLE 1.4

Reference Table for different levels of "timeElapsedCharge"

| The "timeElapsedCharge" stages | As a Percentage of SOC | Value for the Reference Protocol shown in this write-up [cRateExpected = 3C, to charge in 20 mins] |
|---|---|---|
| timeElapsedCharge_1 (tEC1) | 20% | 5 Mins |
| timeElapsedCharge_2 (tEC2) | 60% | 10 Mins |

TABLE 1.5

Reference Table for different levels of "stepTimefactor"

| The "stepTimeFactor" levels [tST = time Step Time] | Value | Value for the Reference Protocol shown in this write-up [cRateExpected = 3C, to charge in 20 mins] StepTime [CTS] = 2 secs |
|---|---|---|
| stepTime_Factor_L1 (tSTFL1) | 1/2 | nlvStepSize = 1 secs |
| stepTime_Factor (tSTF) | 1 | nlvStepSize = 2 secs |

TABLE 1.5-continued

Reference Table for different levels of "stepTimefactor"

| The "stepTimeFactor" levels [tST = time Step Time] | Value | Value for the Reference Protocol shown in this write-up [cRateExpected = 3C, to charge in 20 mins] StepTime [CTS] = 2 secs |
|---|---|---|
| stepTime_Factor_H1 (tSTFH1) | 5 | nlvStepSize = 10 secs |
| stepTime_Factor_H2 (tSTFH2) | 8 | nlvStepSize = 16 secs |
| stepTime_Factor_H3 (tSTFH3) | 9 | nlvStepSize = 18 secs |
| stepTime_Factor_H4 (tSTFH4) | 10 | nlvStepSize = 20 secs |
| stepTime_Factor_H5 (tSTFH5) | 12 | nlvStepSize = 24 secs |

Figure 6:
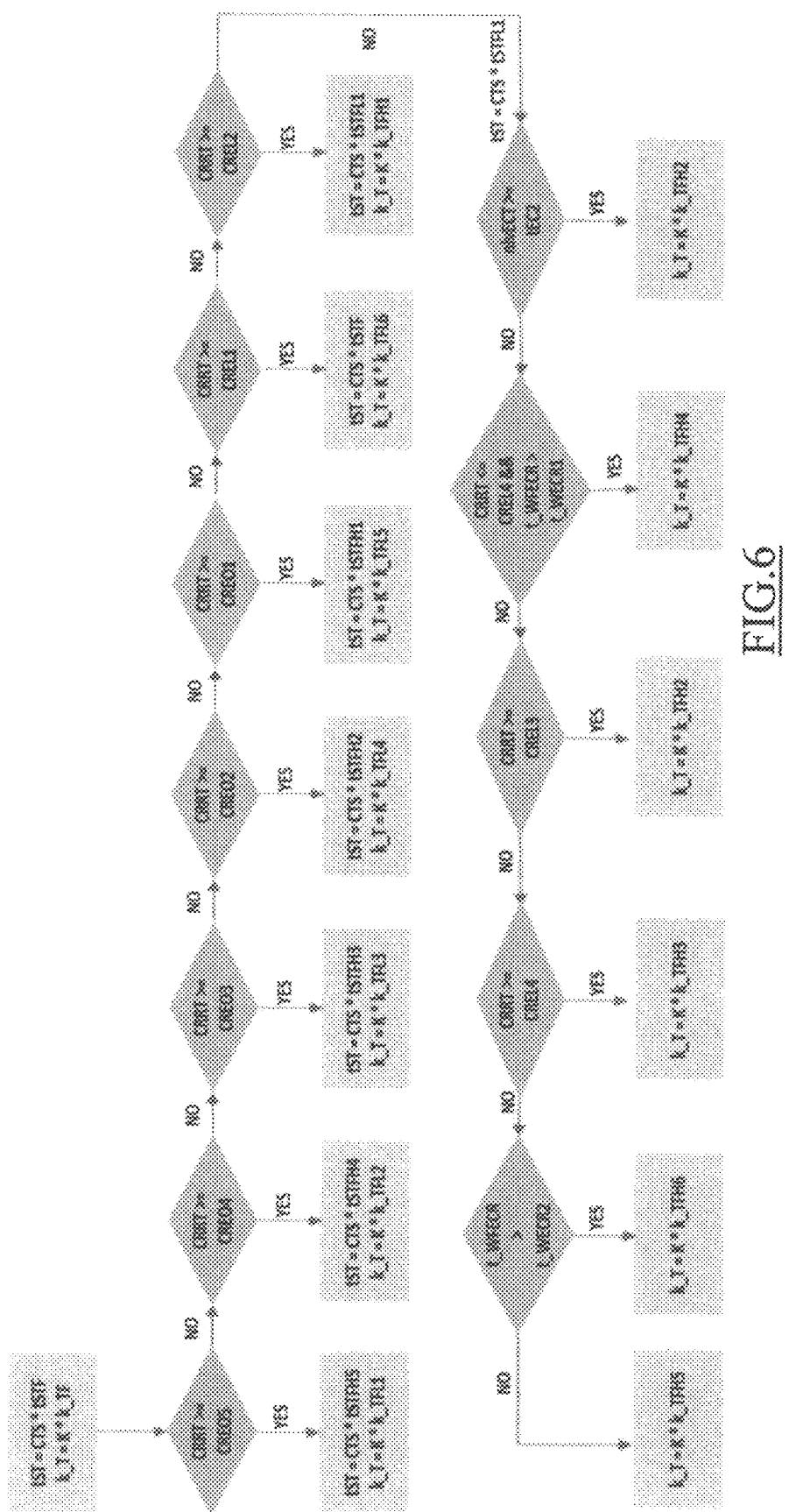
FIG. 6 illustrates the process flow of Training K and StepTime.
Figure 7:
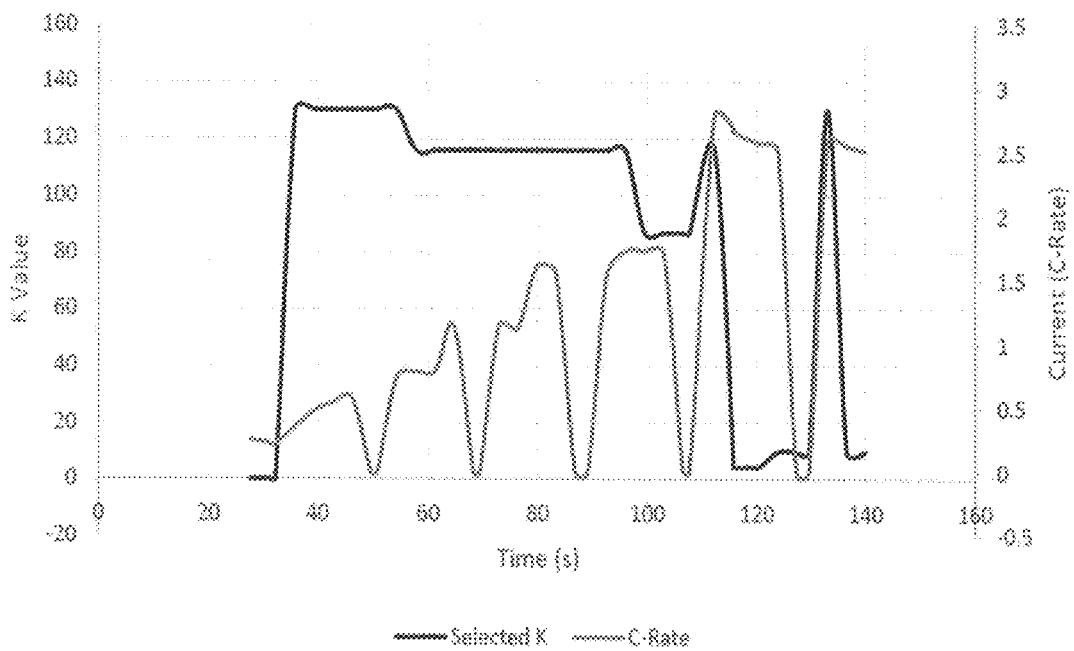
FIG. 7 illustrates an A K-Value profile during the initial part of charging, during first (1-2) minutes [@ about 0% SOC]

The flow in FIG. 6 explains how the K-Value and Step-Time are controlled based on the parameters shown in the above tables [1.1-1.5]:

As per the FIG. 7, the "Default K (K*k_TF)" and "Default Step Time" will be used only for the very first step in NLV-based charging. For all the subsequent steps, the above training algorithm will be applied and find the best suitable "K Value" and "Step Time."

Therefore, it is guaranteed that these parameters get adjusted based on the SOC and SOH of the battery, which causes the possible drawn Current to be different.

As illustrated by FIG. 7, whenever the drawn C-Rate is very low, the K-Value has rapidly increased. Yet, the current has tempted to increase gradually at a space where the battery is capable of handling it.

Also, when the C-Rate is high, the K-Value decreases, the K-Value decreases to a very low value only when the system attempts to draw a current, which has the C-Rate closer or above the expected C-Rate.

Figure 8:
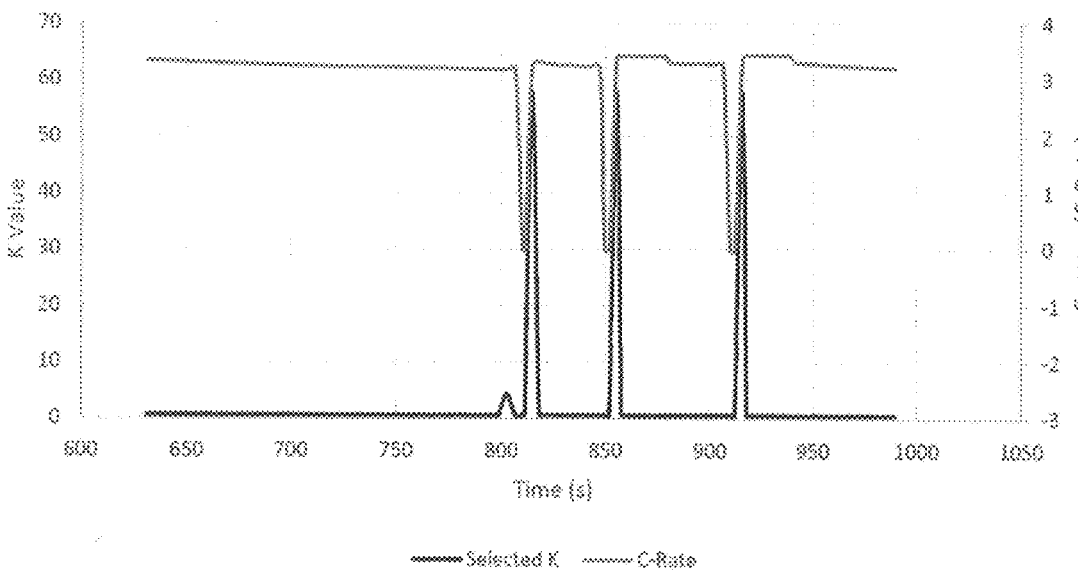
FIG. 8 illustrates an A K-Value profile during the initial part of charging, during (11-16) minutes [@ about 40% SOC]

As illustrated by FIG. 8, when the SOC is about half of the full-capacity, the K-Value becomes very low as the battery has a high potential of drawing high Current.

Figure 9:
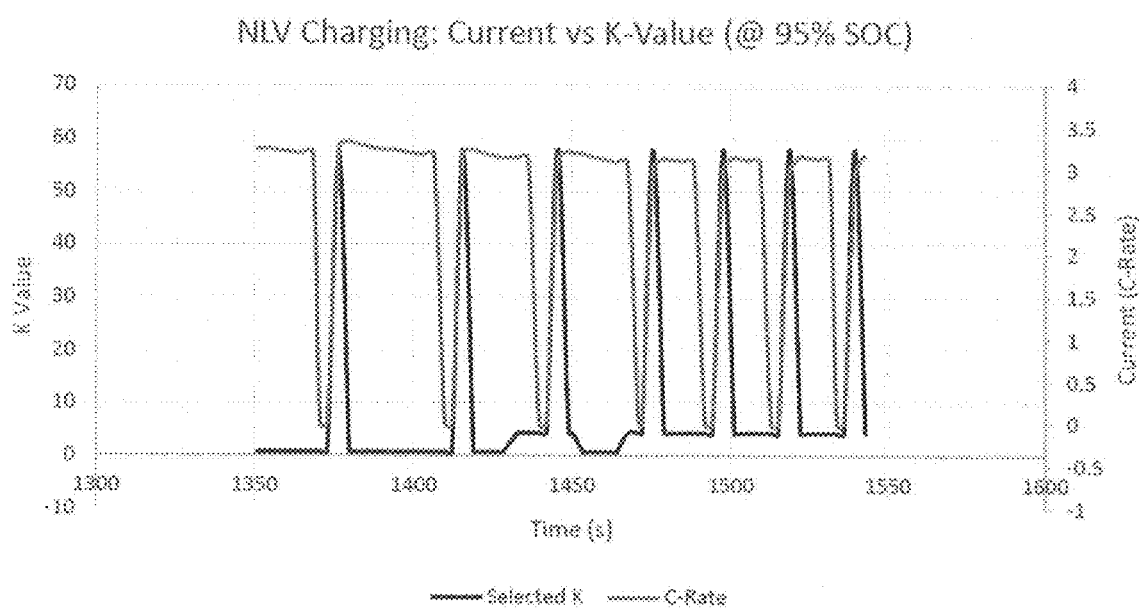
FIG. 9 illustrates an A K-Value profile during the initial part of charging, during (23-25) minutes [@ about 95% SOC]

As illustrated by FIG. 9, when the SOC is close to the full-capacity, the K-Value becomes fluctuating rapidly and tries to maintain a high drawing Current.

[J] Adjust the "Target End Voltage"

The idea of having an Adjustable "Target End Voltage" is to enhance the gain capacity depending on its SOC and SOH. Whenever the battery has a good SOH, a major part of the charge capacity can be drawn within a lover voltage range. So, the system sets a "Default Target End Voltage" as an exit point for the NLV charging at the beginning. Whenever the real-time-voltage of the battery reaches this "Default Target End Voltage," the system checks the C-Rate driven by the real-time Current at that time. Then based on this C-Rate, the system determines whether to increase the "Target End Voltage" and continue charging or stop charging at this point. To determine this based on the C-Rate, there are two methods considered in the protocol:

The Specific Polarization Profile-based Acceptable "Target End Voltage"

Here the system needs the pre-processed information about the polarization profile of the battery type, which is used as the target for Charging. Therefore, the protocol should be tuned for different battery types.

The Default "Target End Voltage" Table

This is intended to serve as a universal controller for the End Voltage for any battery type. Also, this table form-up as an average polarization profile, which can be used whenever the "Specific Polarization Profile" is not available for the battery type being targeted for charging. It also intends to train itself based on the charging statistics.

Following Table 1.6 is used as the "Default End Voltage Table" for the reference protocol, which was explained here:

TABLE 1.6

The Default End Voltage Table based on empirical data

| C-Rate of the Last Drawn Current (Rounded to an Int) | Adjusted End Voltage [when the Default "End Voltage" = 4.65 V] |
|---|---|
| 1C | 4.65 V |
| 2C | 4.75 V |
| 3C | 4.85 V |

Figure 10:
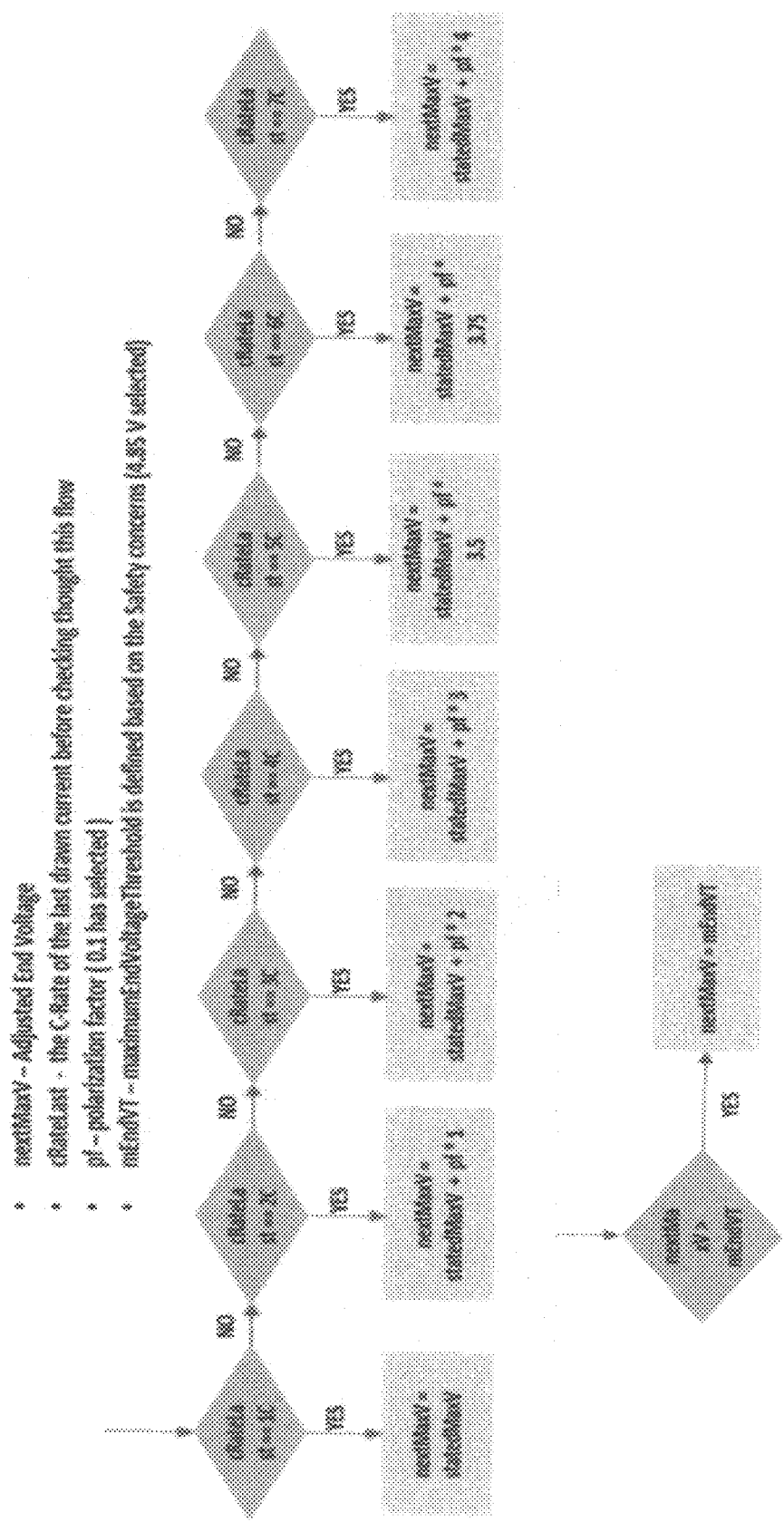
FIG. 10 represents the process flow of controlling "End Voltage"

Table 1.6 corresponds to the End Voltage values if the "Default End Voltage" was selected as 4.65 V. But this is again a customizable parameter where it can change under system/user preferences. Yet, the intention is to have a range for this based on the battery type/chemistry. Therefore, as a global control logic, handling the "Adjustable End Voltage" can be shown as below, FIG. 10.

[K] Exit Criteria

There are three different criteria to decide on when to stop the charging process.
1. Once the system reached the "Maximum End Voltage"
2. Once the battery gained the required full capacity
3. Learning-based Current Profile Comparison If the current profile closely matches with that of any previous current profiles seen during similar exit situations, the learning algorithm intends to improve on its exit profile. Depending on the availability of the above three methods, the same precedence as 1, 2 and 3 will be considered to decide on whether to exit.

[L] Manage REST

Managing the Rest is always applying zero (0) Current to the battery. The charge cycles will pass-over during this Rest period.

[M] Exit NL V

Once at least one criterium is made, the NLV charging will stop. But, depending on how much of a capacity-gain was reached, the system decides whether to go through another round of CC [with 2C constant current charging] or NLV again.

[N] Apply End-CC

Constant Current charging at 2 C will be applied during 2 minutes at the end of NLV charging to gain further Capacity if the NLV driven capacity is not sufficient compared to the target. This Constant Current and its Duration is configurable as the system parameters.

Figure 11:
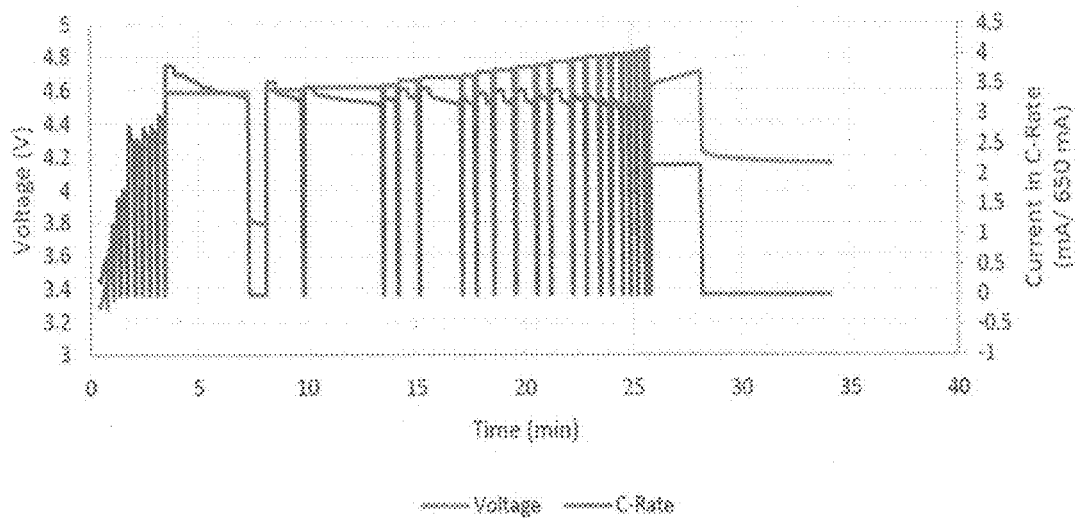
FIG. 11 represents Voltage and Current Profiles of a Random Test 1.
Figure 12:
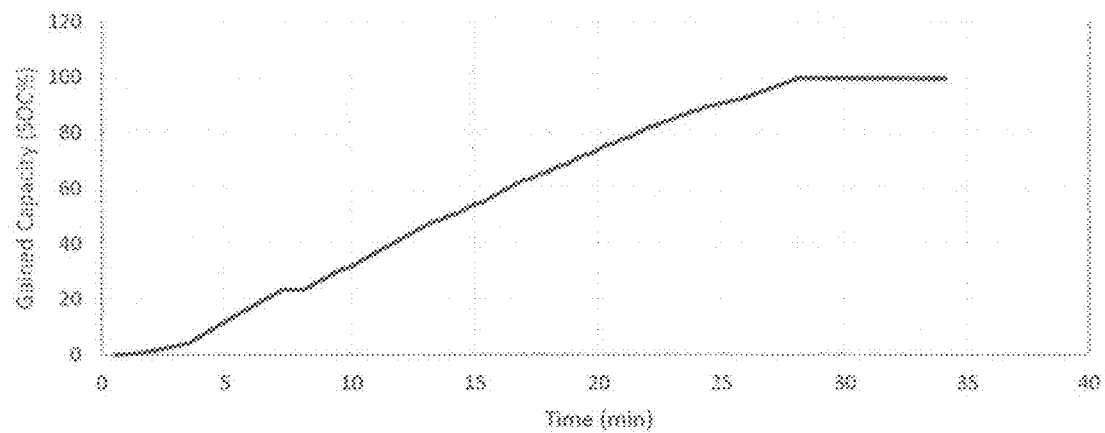
FIG. 12 represents Voltage and Current Profiles of a Random Test 1.

With reference to FIGS. 11 and 12, this is an average profile of the tests, which went up to 24 cycles without any issue, until it was stopped purposely.

Multi-Stage k-Value Management

The K-Value is changed based on how best the battery can draw the expected C-Rate of current of above. If it draws a very low C-Rate, the K-Value will be rapidly increasing to model a sudden spike in Voltage and subsequently results in high current. If it draws the expected C-Rate or higher, the K-Value changed to very low and tries its best to gain the maximum possible charge with that high-current charging. In other cases, the K-value changed to maintain the expected C-Rate all the time, as much as possible.

Figure 13:
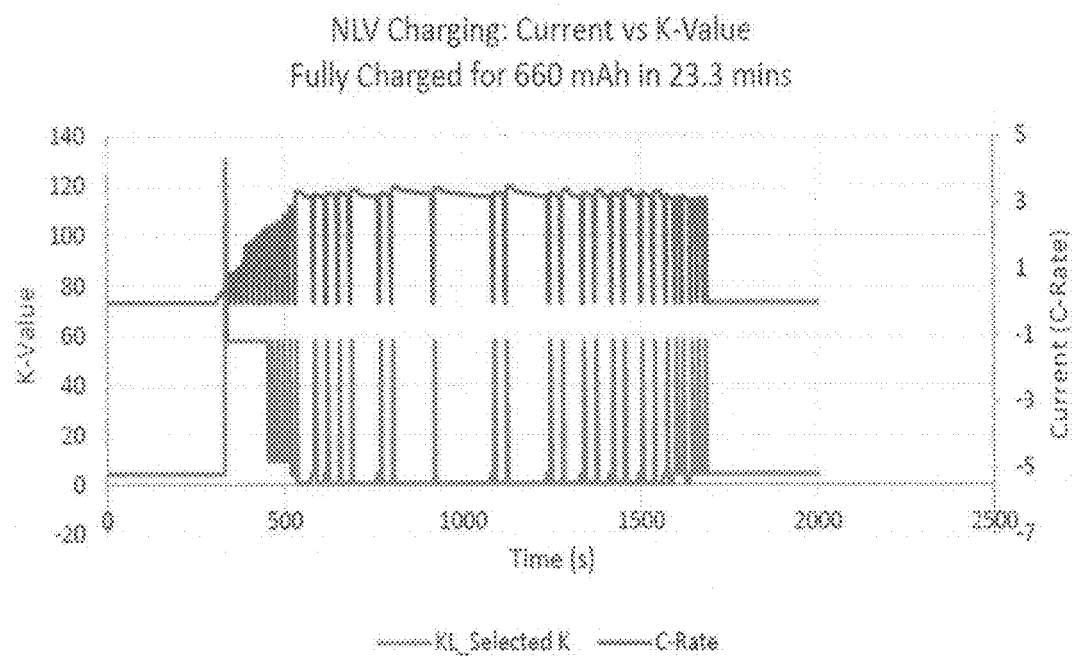
FIG. 13 illustrates NLV Charging: Current versus K-Value during the NLV-Charge ended in Fully Charged up to 660 mAh in just 23.3 minutes, Random Test 1.

FIG. 13 illustrates NLV Charging: Current and K-Value versus Time during the NLV-Charge ended in Fully Charged up to 660 mAh in just 23.3 minutes, Random Test 1.

Figure 14:
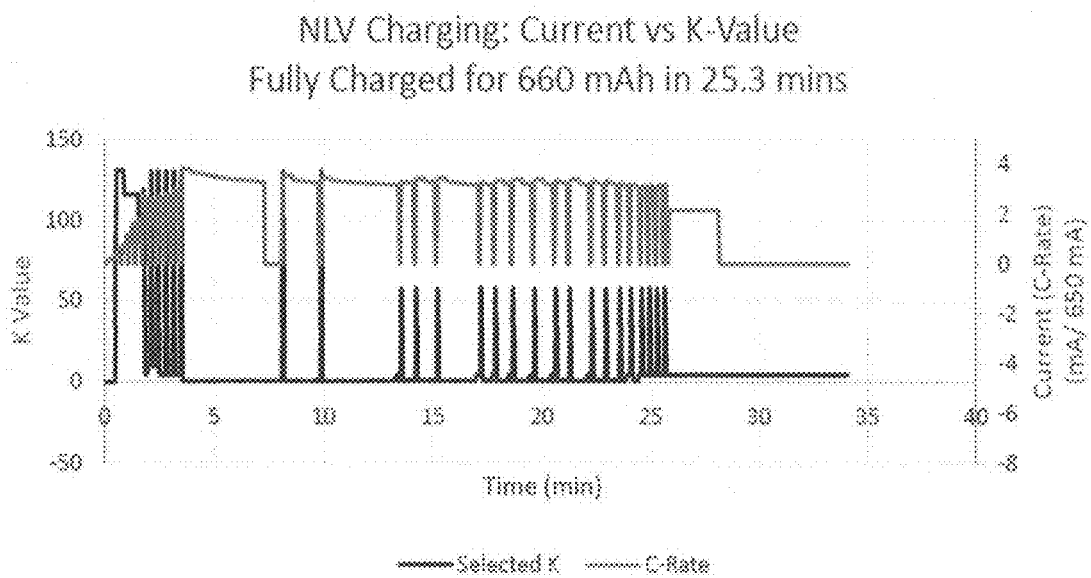
FIG. 14 illustrates NLV Charging: Current versus K-Value during the NLV-Charge ended in Fully Charged up to 660 mAh in just 25.3 minutes, Random Test 2.

FIG. 14 illustrates NLV Charging: Current and K-Value during the NLV-Charge ended in Fully Charged for 660 mAh in 25.3 minutes, Random Test 2.

Figure 15:
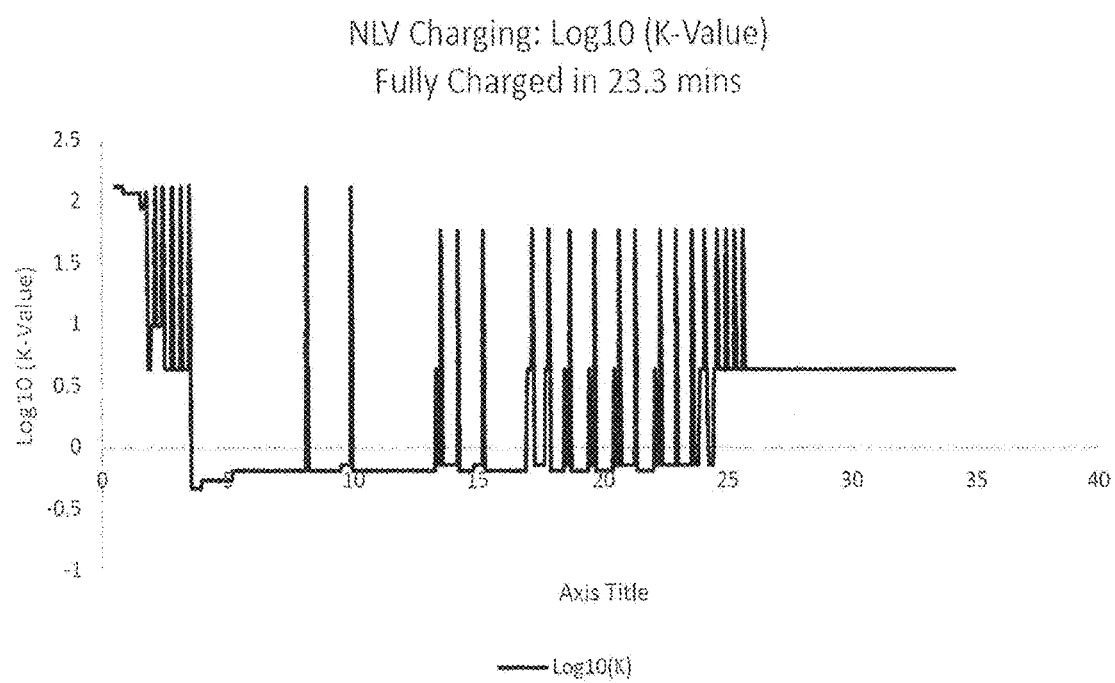
FIG. 15 illustrates a K-Value variation at Log 1O-based scale.

A variation of K versus Time in a Logarithmic Scale is represented in FIG. 15.

Figure 16:
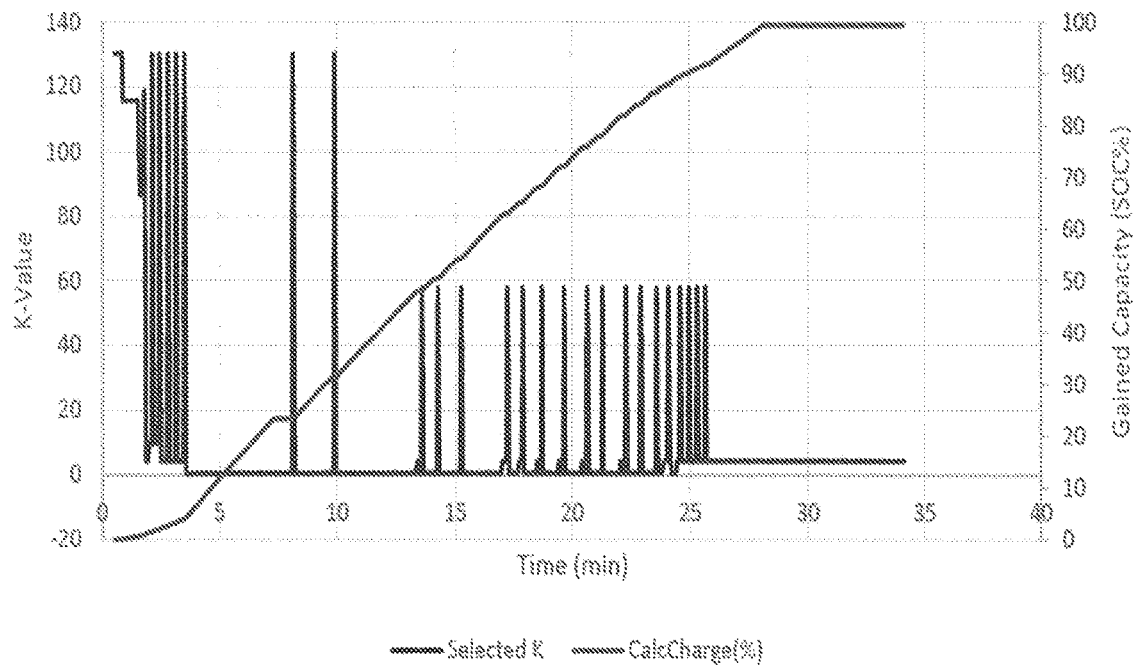
FIG. 16 illustrates NLV Charging: "K-Value" and "SOC versus Time.
Figure 17:
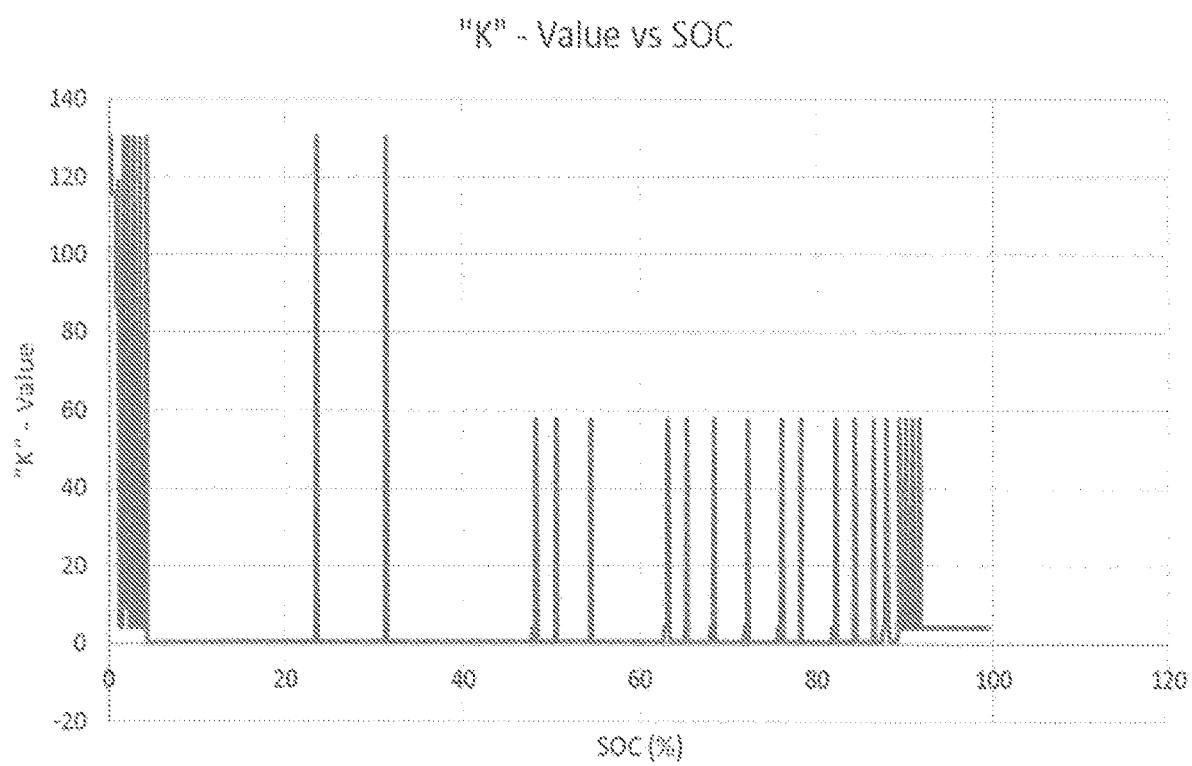
FIG. 17 illustrates "K"-Value versus SOC.

For NLV charging; the variation of "K-value" and SOC versus Time is represented in FIG. 16, while the evolution of "K"-value versus SOC is represented in FIG. 17.

Figure 18:
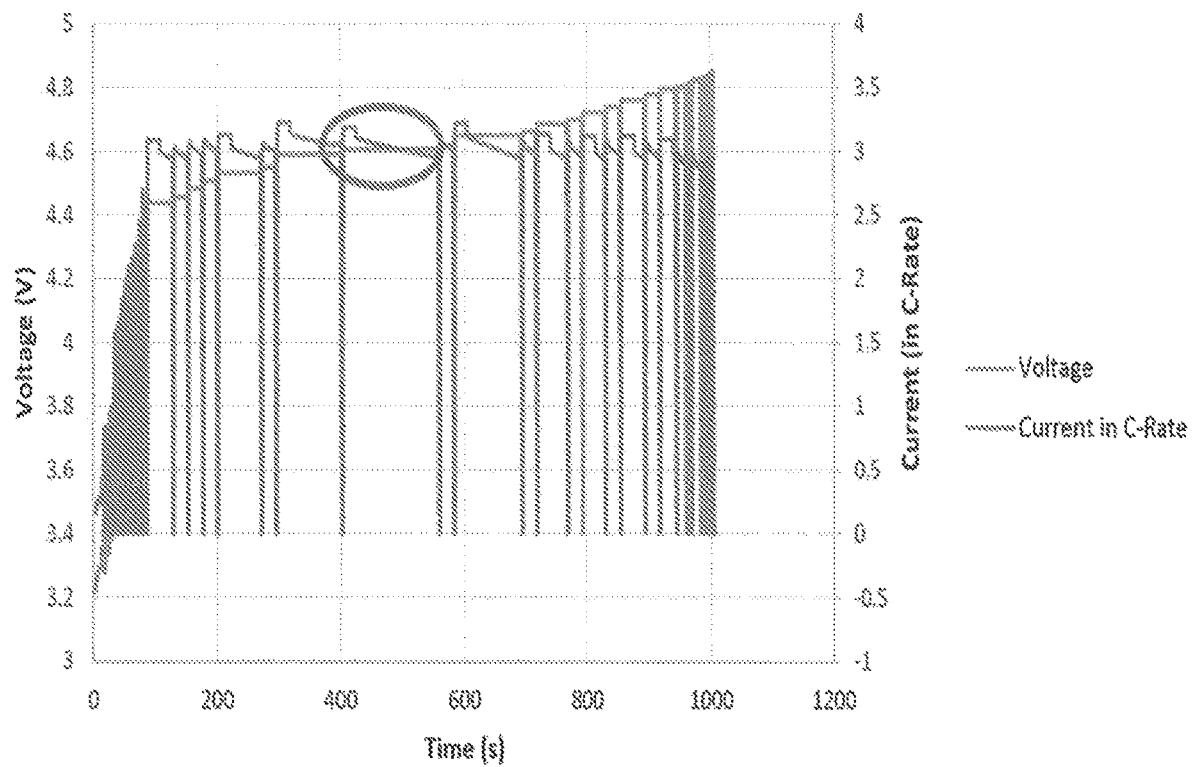
FIG. 18 represents results of a Random Test 3, with 13450 Cells: 98% Charge Gain in just 22 minutes.

The graph in FIG. 18 shows the charging-profile of the NLV-based adaptive charging protocol applied to 13450 cells. This has charged a battery of 700 mAh stated-capacity in just 28 minutes up-to 99% charge with a gained-capacity of 695 mAh.

During the process,
it has gained over the 2C-based charge during a half of its process.
also a quarter of its full charging time was drawing the current above 3 C and this has occurred at the very end.

The highlighted segment was further analyzed to envisage the workings in the protocol.

Figure 19:
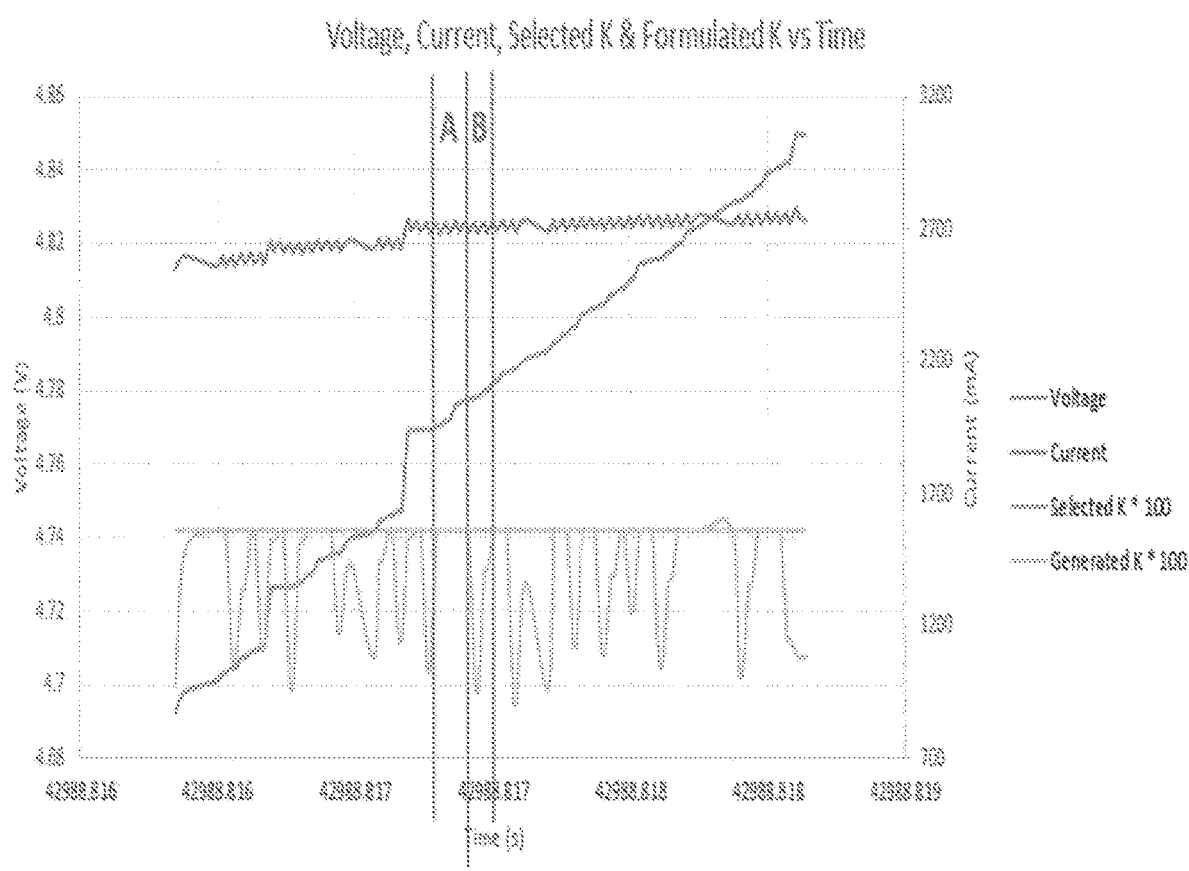
FIG. 19 represents K-Value Voltage ramp compensation over a drop of current.

Analyzing around 100 samples from the highlighted section in FIG. 19:
Selected K: This is the K that was pre-selected and injected to the AC
Generated K: This is the K that was re-calculated based on the derived "V-nlv-next" using the above K.
Both of the above K are multiplied by 1000 to show the variation clearly in the following graph.
As shown in the next section, this variation seen in the "Generated K" versus "Selected K" is due to the precision error as the Voltage rise is always in very small amounts (mV).

The A and B segments shown above have been examined closely in the next section with reference to FIGS. 24 and 25:
A: Generated K is the same as the Selected K during this period.
B: Generated K has deviated from the Selected K during this period.

The above "B" segment is shown in the rectangular frame in the table of FIG. 25.

The "AVG (Abs (dI/dt))" and "dV/dt" are calculated for respective Current and Voltage variations collected during the charging process.

*Further, the formation of [dI/dt (n−1)] and [dI/dt (n−2)] can be realized by review of FIG. 25.

As shown in FIG. 25, the Current has dropped during this "B" segment. Therefore, both the dI and dv has shown a sudden hike or a drop. This has caused the multiplication precisions to make a deviation in their product.

Comparison of Charge Capacity and the Usable Discharge Capacity

Figure 20:
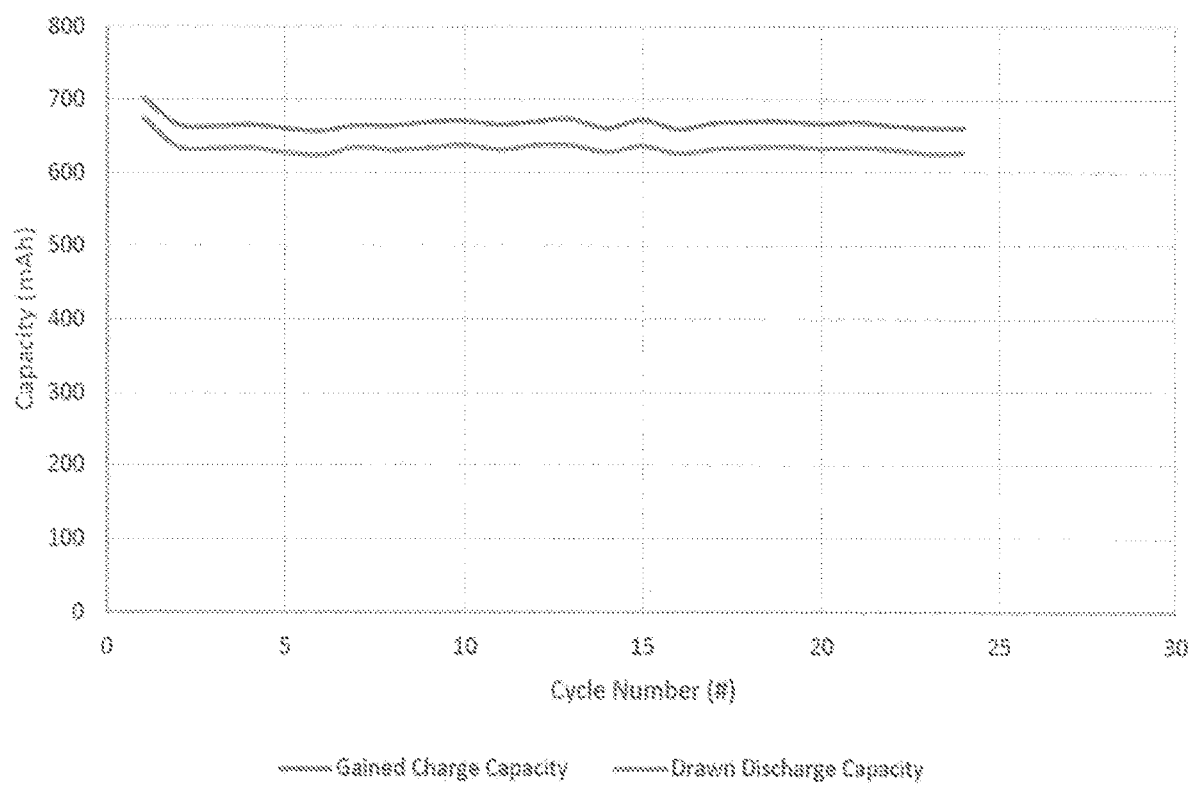
FIG. 20 illustrates Charge Capacity and Discharge Capacity versus Cycle Number during NLV-Based Charging, Avg Charge Time at 23.45 minutes.

FIG. 20 shows that the Discharge capacity maintain almost constant at around 630 mAh, which is about 97% of the stated capacity of the battery. Therefore, it proves that this NLV-based charging method doesn't contribute much into capacity fading over time.

This is a very good advantage over other competitive Fast Charging methodologies, which are mostly based on directly imposing high current.

Figure 21:
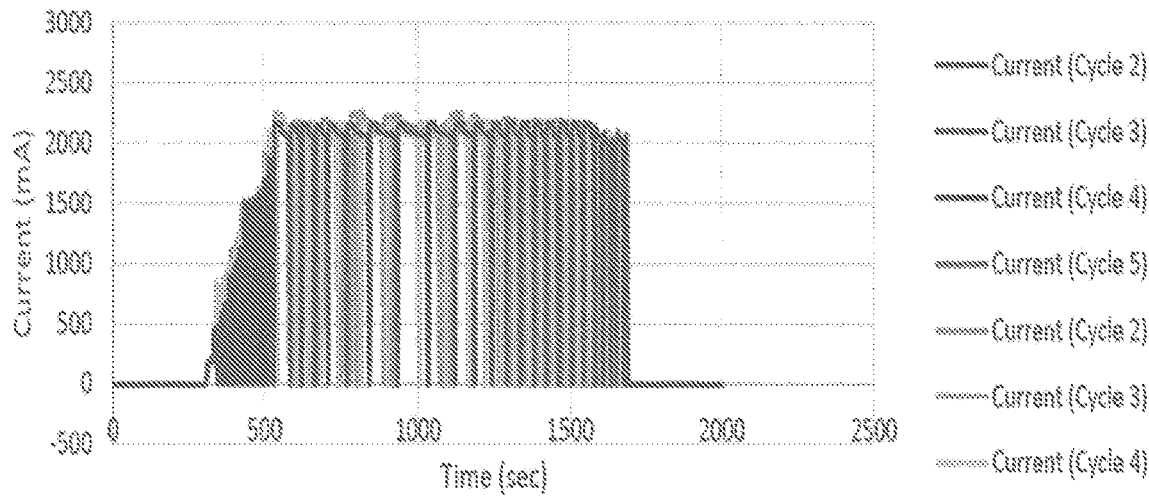
FIG. 21 illustrates Current versus Time During a Number of Charge Cycles using NLV.
Figure 22:
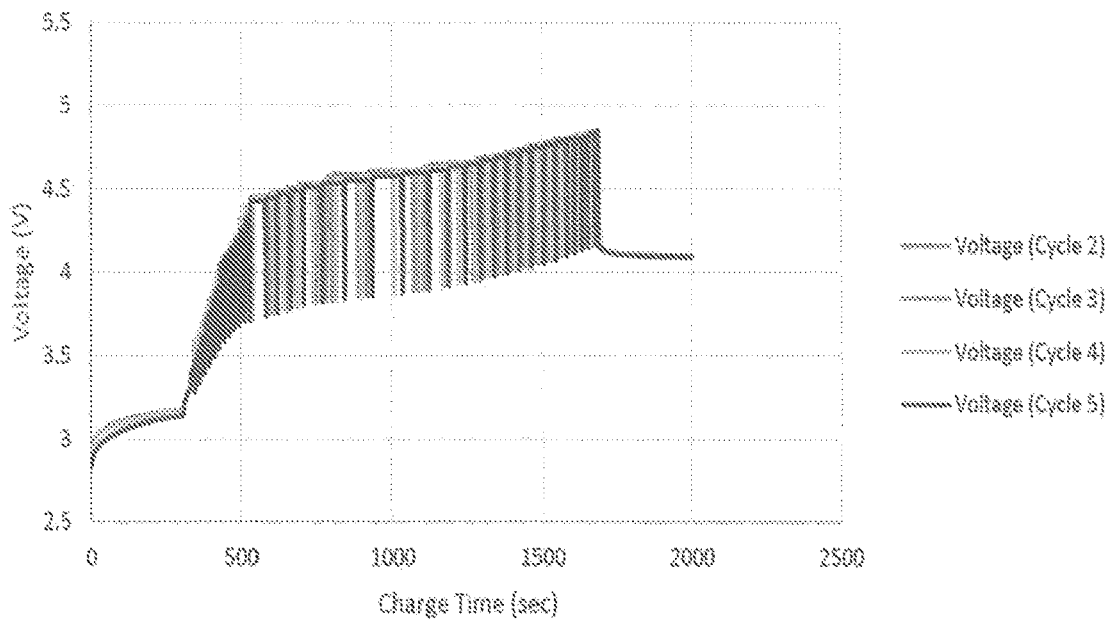
FIG. 22 illustrates Voltage versus Time over a Number of NLV-based Charge Cycles.

FIGS. 21 and 22 show that even after multiple cycles of NLV-based charging, still the charging profile of current and voltage stays mostly the same. This is another proof to show that the cells are not damaged due to this fast charging process.

ACP based on the Inverse of Polarization (IP)

This method intends to analyze the polarization profile of the type of the battery to be charged. Accordingly, it can automatically calculate what sort of a current profile to be maintained during charging to fast charge the battery compensating the less polarize zones. The following equation will be used to derive the expected Current to charge using this method:

$$I(\Delta SOC) = M(\acute{\eta})\beta$$

$\Delta SOC$: This is the gained capacity at any point of time ($0\% <= \Delta SOC <= 100\%$).

M: This is a constant factor for a certain range of $\Delta SOC$, but it can change based on the $\Delta SOC$ and the battery type.

$\acute{\eta}$: This is the inverse of polarization in different $\Delta SOC$s.

$\beta$: This is a constant for a battery and determines by the polarization data.

Using the above equation as the basic principle, number of tests were done to derive the best current profile for faster charging based on the polarization data. Also, different relaxation durations were applied to protect the battery health during charging.

Polarization Data

FIG. 26 shows the polarization data for the 13450 Lithium-Ion battery cells when charging at high currents of C, 3C and 6C at every 5% of state of charge (SOC).

Accordingly, the $\acute{\eta}$ (inverse of polarization) gives the base to determine the possible Charging Current based on different SOCs. With the information of how long the system is given to charge the battery, it can interpolate the best current profile with its relaxation patterns to be used.

Figure 23:
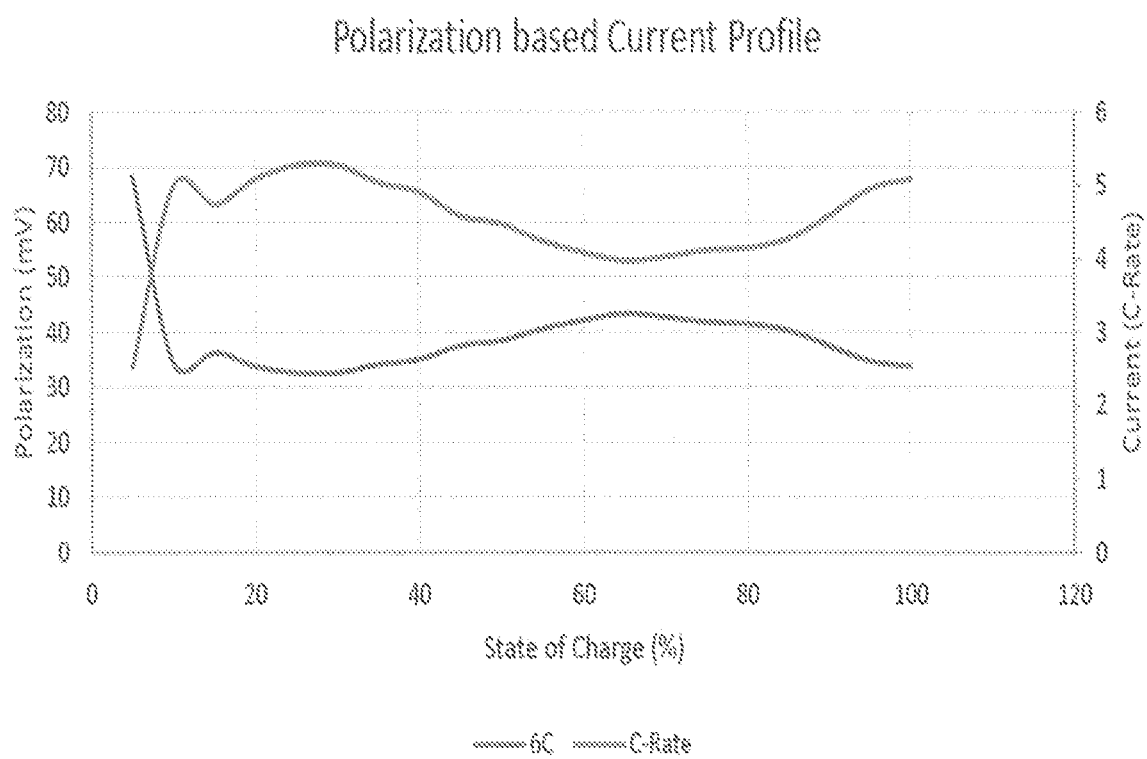
FIG. 23 illustrates Polarization and its average Current Profiles for a battery charge in about 18 minutes with relaxation.

FIG. 23 shows an example of an average current profile to charge the battery in about 18 minutes with relaxation. Also, it can be used to charge the battery less than 14 minutes without relaxation.

REFERENCES

[1] S. S Zhang, "The effect of the charging protocol on the cycle life of a Li-ion battery," Journal of Power Sources, Vol. 161, Oct. 27, 2006, pp. 1385-1391.

[2] Ronald Baroody, "Evaluation of rapid electric battery charging techniques," University of Nevada Las Vegas, 2009.

[3] D. Ansean, V. M. Garcia, M. Gonzalez, J. C. Viera, J. C. Anton, C. Blanco, "Efficient fast-charging strategies for Li-ion batteries," University of Oviedo, Gijon, Spain, KINTEX, Korea, May 2015.

[4] Venkatasailanathan Ramadesigan, Paul W. C. Northrop, Sumitava De, Shiram Santhanagopalan, Richard D. Braatz, Venkat R. Subramanian, "Modeling and Simulation of Lithium-Ion Batteries from a Systems Engineering Perspective," Journal of The Electrochemical Society, Jan. 26, 2012.

[5] Elie Ayoub, Nabil Karami, "Review on The Charging Techniques of a Li-ion Battery," University of Balamand, Koura, Lebanon, TAEECE, 2015.

[6] Martin Z. Bazant, "Theory of Chemical Kinetics and Charge Transfer based on Nonequilibrium Thermodynamics," Massachusetts Institute of Technology, Cambridge Mass. 02139, United States, 2012.

[7] Liang He, Eugene Kim, Kang G. Shin, "*-Aware Charging of Lithium-ion Battery Cells," The University of Michigan, Ann Arbor, Mich., USA, 2016.

[8] D. Andrea, "Battery management systems for large Lithium-ion battery packs," Artech House, 2010.

[9] Jiang J C, Zhang C P, Wen J P, et al. "An optimal charging method for Li-ion batteries using a fuzzy-control approach based on polarization properties," IEEE Trans Veh Technol 2013; 62 (7):3000-9.

[10] Jiang J C, Liu Q J, Zhang C P, et al. "Evaluation of acceptable charging current of power Li-ion batteries based on polarization characteristics," IEEE Trans Ind Electron 2014; 61 (12):6844-51.

[11] I.-S. Kim, "The novel state of charge estimation method for lithium-ion battery using sliding mode observer," Journal of Power Sources, 163 (1):584-590, 2006.

[12] X. Hu, F. Sun, Y. Zou, "Estimation of state of charge of a lithium-ion battery pack for electric vehicles using an adaptive luenberger observer," Energies, 2010.

The invention claimed is:

1. An adaptive charging protocol (ACP) implemented for fast-charging a rechargeable battery having electrode terminals connected to terminals of a power supply provided to apply time-varying voltages to the electrodes, the protocol implementing a Non-Linear Voltammetry (NLV) method and comprising, before starting a charging operation for the battery, the steps of:
    detecting an existence of historical data on previous charging operations for the battery,
    in case of detection, processing the historical data to adjust charging parameters in view of optimizing the charging operation; and
    in absence of detection, electrically testing the battery to get data on variations of a state of charge (SOC) for the battery for building a learning model on the SOC variations to be used for optimizing the charging operation,
    wherein the charging operation comprises the following steps:
        a Linear Sweep Voltammetry (LSV) step, for a short duration, the LSV step comprising an analysis of current and voltage on battery terminals, and
        a series of successive NLV steps, each NLV step being assigned a next-set voltage and being followed b a relaxation step for a relaxation time during which no voltage and/or no current is applied to the battery terminals, continuing until at least one exit-charging criterion among a group of exit-charging criteria is reached.

2. The adaptive charging protocol of claim 1, further comprising a step of detecting battery system requirements and a step of processing the battery system requirements in view of optimizing the charging operation.

3. The adaptive charging protocol of claim 1, wherein the next set voltage is computed from the following equation:

$$K_n = \frac{dV}{dt}\left(\frac{dI}{dt}\right)^\alpha$$

where Kn is a constant value for a certain period during charging,
dV/dt (V/s) is a rate of change of cell Voltage V during the charging process/the relaxation step time duration,
dI/dt (mA/s) is the absolute value of a rate of change of charging Current I during the charging process/the step time duration, and
α is a coefficient between 0.1 and 100.

4. The adaptive charging protocol of claim 1, wherein the relaxation time is determined depending on the state of charge (SOC) of the battery.

5. The adaptive charging protocol of claim 1, further comprising a step for training the K value based on examining the charging current drawn by the battery versus an expected charging rate current for the battery.

6. The adaptive charging protocol of claim 1, wherein exit-charging criteria comprise reaching a Target End Voltage (tev).

7. The adaptive charging protocol of claim 1, wherein exit-charging criteria comprise reaching a predetermined level of gained state of charge (SOC) based on a Coulomb counting.

8. The adaptive charging protocol of claim 1, wherein exit-charging criteria comprise determining a pattern matching of a current profile based on artificial intelligence.

9. The adaptive charging protocol of claim 1, implementing an Inverse of Polarization (IP) method, wherein the charging operation comprises the steps of:
    analyzing a polarization profile of the battery to be charged,
    calculating a profile for the current to charge from the power supply into the battery in view of compensating less polarized zones within the battery.

10. The adaptive charging protocol of claim 9, wherein the expected current to charge is computed using the following equation:

$$I(\Delta SOC)=M(\acute{\eta})\beta$$

where: ΔSOC is a gain in state of the charge for the battery at any time,
M is a constant for a certain range of gains ΔSOC, based on the ΔSOC and the battery type,
$\acute{\eta}$ is the inverse of polarization in different ΔSOCs, and
β is a constant for the battery, determined by polarization data.

11. The adaptive charging protocol of claim 10, further comprising a plurality of relaxation steps with predetermined relaxation durations, during which no voltage and/or no current is applied to the battery terminals.

12. The adaptive charging protocol of claim 1, implementing both Non-Linear Voltammetry (NLV) and Inverse of Polarization (IP) charging methods, wherein implementation of one method among the NLV or IP charging methods is dynamically decided depending on adaptive requirements issued from the battery system and/or on information on State of Health (SOH) issued from the battery system and/or on calculated data on the variations ΔSOC in the State of Charge (SOC) of the battery.

13. The adaptive charging protocol of claim 1, implemented for charging a rechargeable battery among a group comprising lithium-ion batteries, nickel-metal hydride batteries (NiMH), nickel-cadmium batteries (NiCd), lead acid batteries (LAB) and sodium-based batteries (NaS, NaNiCl2).

14. A system for fast-charging a rechargeable battery, the battery having terminals connected to internal electrochemical cell electrodes and an initial state of charge (SOCi), the fast-charging system comprising:
    a power supply positioned in electrical communication with the electrodes for providing a controllable time varying charging voltage applied to the battery terminals, thereby generating a charging current resulting in charging of the electrochemical cells from the initial state of charge (SOCi) to a state-of-charge target value (SOCf),
    a charging-control processor for controlling the power supply programmed for:
        detecting an existence of historical data on previous charging operations for the battery, in case of detection, processing the historical data to adjust charging parameters for optimizing the charging operation; and in absence of detection, electrically testing the battery to get data on variations of the state of charge (SOC) for the battery for building a learning model on the SOC variations to be used for optimizing the charging operation wherein the charging-control processor is further programmed to implement a Non-Linear Voltammetry (NLV) method and to implement the following steps:

a Linear Sweep Voltammetry (LSV) step, for a short duration, the LSV step comprising an analysis of current and voltage on battery terminals, and a series of successive NLV steps, each NLV step being assigned a next-set voltage and being followed by a relaxation step for a relaxation time during which no voltage and/or no current is applied to the battery terminals, continuing until at least one exit-charging criterion among a group of exit-charging criteria is reached.

15. The fast-charging system of claim 14, wherein the charging-control processor is further programmed for processing battery system requirements for optimizing the charging operation.

16. The fast-charging system of claim 14, wherein the charging-control processor is further programmed to implement an Inverse of Polarization (IP) method.

17. The fast-charging system of claim 14, wherein the charging-control processor is further programmed to implement both Non-Linear Voltammetry (NLV) charging and Inverse of Polarization (IP) charging, and dynamically decide on which charging method to be implemented, depending on adaptive requirements issued from the charging system and/or on information on State of Health (SOH) issued from the charging system and/or on calculated data on variations ΔSOC in the State of Charge (SOC) of the battery.

18. The fast-charging system of claim 14, wherein the system is configured for charging a rechargeable battery among a group comprising of lithium-ion batteries, nickel-metal hydride batteries (NiMH), nickel-cadmium batteries (NiCd), lead acid batteries (LAB) and sodium-based batteries (NaS, NaNiCl2).

19. A controller for controlling a system for fast-charging a rechargeable battery from a power supply, the battery having terminals connected to internal electrochemical cell electrodes and an initial state of charge (SOCi), programmed for:

detecting an existence of historical data on previous charging operations for the battery, in case of detection, processing the historical data to adjust charging parameters for optimizing the charging operation; and in absence of detection, electrically testing the battery to get data on variations of the state of charge (SOC) for the battery, in view of building a learning model on the SOC variations to be used for optimizing the charging operation, wherein the controller is further programmed to implement a Non-Linear Voltammetry (NLV) method and to implement the following steps:

a Linear Sweep Voltammetry (LSV) step, for a short duration, the LSV step comprising an analysis of current and voltage on battery terminals, and a series of successive NLV steps, each NLV step being assigned a next-set voltage and being followed by a relaxation step for a relaxation time during which no voltage and/or no current is applied to the battery terminals, continuing until at least one exit-charging criterion among a group of exit-charging criteria is reached.

20. The fast-charging controller of claim 19, further programmed for processing battery system requirements in view of optimizing the charging operation.

21. The fast-charging controller of claim 19, further programmed to implement an Inverse of Polarization (IP) method.

22. The fast-charging controller of claim 19, further programmed to implement both Non-Linear Voltammetry (NLV) charging and Inverse of Polarization (IP) charging, and to dynamically decide on which charging method to be implemented, depending on adaptive requirements issued from the charging system and/or on information on State of Health (SOH) issued from the battery system and/or on calculated data on variations ΔSOC in the State of Charge (SOC) of the battery.

* * * * *